(12) United States Patent
Harada et al.

(10) Patent No.: US 7,671,658 B2
(45) Date of Patent: Mar. 2, 2010

(54) MIXER HAVING FREQUENCY SELECTION FUNCTION

(75) Inventors: Hiroyuki Harada, Ishikawa (JP); Hikaru Ikeda, Osaka (JP); Masato Takata, Ishikawa (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 11/802,192

(22) Filed: May 21, 2007

(65) Prior Publication Data

US 2007/0275684 A1 Nov. 29, 2007

(30) Foreign Application Priority Data

May 24, 2006 (JP) ............................. 2006-144279

(51) Int. Cl.
*G06G 7/25* (2006.01)
(52) U.S. Cl. .................. 327/355; 327/554; 327/94; 455/326
(58) Field of Classification Search .................. None
See application file for complete search history.

(56) References Cited

U.S. PATENT DOCUMENTS

| 5,414,311 | A | | 5/1995 | Carley | |
|---|---|---|---|---|---|
| 6,147,522 | A | * | 11/2000 | Rhode et al. | .................. 327/93 |
| 6,509,790 | B1 | * | 1/2003 | Yang | .......................... 327/554 |
| 6,570,519 | B1 | * | 5/2003 | Yang | .......................... 341/143 |
| 7,336,938 | B1 | * | 2/2008 | Wong | .......................... 455/296 |
| 2003/0040294 | A1 | | 2/2003 | Staszewski et al. | |
| 2003/0080888 | A1 | | 5/2003 | Muhammad et al. | |
| 2004/0242175 | A1 | * | 12/2004 | Lin | ............................. 455/147 |
| 2005/0104654 | A1 | | 5/2005 | Muhammad et al. | |
| 2005/0184828 | A1 | * | 8/2005 | Son et al. | ..................... 333/174 |
| 2007/0275684 | A1 | * | 11/2007 | Harada et al. | ............. 455/185.1 |
| 2009/0002066 | A1 | * | 1/2009 | Lee et al. | ..................... 327/554 |

FOREIGN PATENT DOCUMENTS

JP 2004-289793 10/2004
WO 01/24192 4/2001

OTHER PUBLICATIONS

David L. Fried, "Analog Sampled-Data Filters," IEEE Journal of Solid-State Circuits, Aug. 1972, pp. 302-304.

* cited by examiner

*Primary Examiner*—Tuan Lam
*Assistant Examiner*—Hiep Nguyen
(74) *Attorney, Agent, or Firm*—Wenderoth, Lind & Ponack, L.L.P.

(57) ABSTRACT

A mixer which has an enhanced frequency selection characteristic and generates no pass loss is realized without using an operation control signal having a frequency higher than a sampling frequency. Provided are a time control section 102 for supplying control signals, a first switched capacitor circuit 100 for outputting a discrete time sample stream of the input signal 107 in accordance with integration operation control signals Lo1 and Lo2, and a second switched capacitor circuit 104 functioning as a high-order IIR filter by sharing a charge, and a frequency of each of the integration operation control signals Lo1 and Lo2 is higher than frequencies of other control signals.

7 Claims, 11 Drawing Sheets

MIXER HAVING FREQUENCY SELECTION FUNCTION

BACKGROUND OF THE INVENTION

1. Field of the Invention

The present invention relates to a mixer for directly sampling a radio frequency signal so as to frequency-convert the radio frequency signal, and for performing frequency selection.

2. Description of the Background Art

A charge sampling technique for sampling a radio frequency signal is disclosed in U.S. Pat. No. 5,414,311. In the technique disclosed in U.S. Pat. No. 5,414,311, a signal voltage is transformed into a signal current proportional to the signal voltage by using a transconductance amplifier, and the signal current is integrated in a capacitor for a predetermined time period so as to output the result as a sampling output, instead of an instantaneous voltage being sampled. After the integration is performed for the predetermined time period and the result is outputted, the capacitor is discharged. The integration and the discharging are periodically performed so as to obtain a discrete signal output. The technique disclosed in U.S. Pat. No. 5,414,311 allows a signal in a frequency band used for radio communication to be directly sampled.

In WO 01/24192, disclosed is a technique for forming a mixer having frequency selection characteristic of passing a signal in a desired frequency band and attenuating signals in frequency bands other than the desired frequency band by using the charge sampling technique. In the technique disclosed in WO 01/24192, the mixer having the frequency selection characteristic allows a radio signal receiver to have a simplified structure.

FIG. 13 shows a conventional circuit, disclosed in US Patent Application Publication No. 2003/0040294 and Japanese Laid-Open Patent Publication No. 2004-289793 (corresponding to US Patent Application Publication No. 2003/080888), in which the charge sampling technique is applied to a mixer having a frequency selection characteristic so as to increasingly enhance the frequency selection characteristic of the mixer. FIG. 14 shows a timing chart of an operation control signal used for the circuit shown in FIG. 13. The circuit is a combination of the charge sampling circuit with a circuit having IIR (infinite impulse response) filter characteristic. A circuit which has IIR filter characteristic and samples a signal is, for example, a switched capacitor circuit including an operational amplifier, a switch and a capacitor. On the other hand, in the circuit disclosed in US Patent Application Publication No. 2003/0040294 and Japanese Laid-Open Patent Publication No. 2004-289793 (corresponding to US Patent Application Publication No. 2003/080888), an IIR filter includes only a switch and a capacitor. Thus, it is unnecessary to provide an operational amplifier, which was a necessary component for a conventional switched capacitor circuit, thereby minimizing increase in consumption of power and circuit scale.

Further, in US Patent Application Publication No. 2005/0104654, disclosed is a technique for improving frequency selection characteristic by cascading IIR filters so as to increase an order (hereinafter, referred to as order increase) of an IIR filter, based on the techniques disclosed in US Patent Application Publication No. 2003/0040294 and Japanese Laid-Open Patent Publication No. 2004-289793 (corresponding to US Patent Application Publication No. 2003/080888). FIG. 15 shows a conventional circuit, disclosed in US Patent Application Publication No. 2005/0104654, in which circuits shown in FIG. 13 are cascaded so as to increase the order. A timing chart of an operation control signal used for the circuit shown in FIG. 15 is the same as the timing chart shown in FIG. 14. Also in this technique, the IIR filter includes only a switch and a capacitor, thereby improving frequency selection characteristic while minimizing increase in consumption of power and circuit scale.

Further, in David L. Fried, Analog Sampled-Data Filters", IEEE Journal of Solid-State Circuits, August, 1972, a technique for forming a high-order IIR filter including only a switch and a capacitor is disclosed. In this technique, when one switch and one capacitor are added to the high-order IIR filter, the order of the IIR filter is incremented by one.

However, the conventional mixer as described above has a problem as descried below. That is, in the conventional arts (see FIG. 13) disclosed in US Patent Application Publication No. 2003/0040294 and Japanese Laid-Open Patent Publication No. 2004-289793 (corresponding to US Patent Application Publication No. 2003/080888), the order of the IIR filter is one, so that frequency selection characteristic is not sufficiently improved.

In the conventional art (see FIG. 15) disclosed in US Patent Application Publication No. 2005/0104654 in which the order of the IIR filter is increased by using the technologies disclosed in US Patent Application Publication No. 2003/0040294 and Japanese Laid-Open Patent Publication No. 2004-289793 (corresponding to US Patent Application Publication No. 2003/080888), frequency selection characteristic is improved while a loss (hereinafter, referred to as pass loss) of output signal level occurs in a signal passband. This is because an integration capacitor Cr2 and an integration capacitor Cr3 are periodically discharged in accordance with a discharge operation control signal RESET1 (see FIG. 14). FIG. 16 is a conceptual diagram illustrating the pass loss occurring in the signal passband in the conventional art disclosed in US Patent Application Publication No. 2005/0104654. As shown in FIG. 16, in the conventional art disclosed in US Patent Application Publication No. 2005/0104654, a pass loss occurs in a signal passband each time an order is increased, and the increase of the order leads to accumulation of the pass loss. US Patent Application Publication No. 2005/0104654 also discloses a technique for eliminating the pass loss. However, it is complicated to set filter characteristic so as to prevent an output of the IIR filter from interfering with an input thereof, resulting in the designing being difficult. Further, it is necessary to substantially increase the numbers of capacitors and switches so as to cascade the IIR filters for increasing the order thereof.

Further, in the conventional art disclosed in David L. Fried, "Analog Sampled-Data Filters", IEEE Journal of Solid-State Circuits, August, 1972, a delay circuit or a control signal having a frequency higher than a sampling frequency is required so as to generate an operation control signal. There is a problem that, when a delay circuit is used, variations in delay time occur. In particular, since a plurality of operation control signals are required so as to increase an order of an IIR filter, it is substantially difficult to compensate the variations in delay times of the plurality of operation control signals. A logic circuit formed by using a technique of designing a synchronous circuit (a method for generating various signals based on a reference CLK) may be used so as to generate a stable operation control signal, instead of the delay circuit being used. However, the operation control signal used in this circuit is required to have a frequency higher than a sampling frequency. When a mixer using the sampling technique is used in a radio communication device, the sampling frequency ranges from several hundred MHz to several GHz. Thus, when the operation control signal having a frequency higher than a sampling frequency is used, the reference CLK generation circuit is complicated and consumption of current is increased, and further consumption of power in the logic circuit is increased.

Further, even a simple combination of the conventional arts described above cannot prevent increase in consumption of current caused by pass loss occurring due to the order increase and by the use of an operation control signal having a frequency higher than a sampling frequency.

SUMMARY OF THE INVENTION

Therefore, an object of the present invention is to provide a mixer which has an enhanced frequency selection function and represents a characteristic of a high-order IIR filter in which no pass loss occurs in a signal passband, without using an operation control signal having a frequency higher than a sampling frequency.

The present invention is directed to a mixer having a frequency selection function. In order to attain the object mentioned above, the mixer of the present invention comprises: a first switched capacitor circuit including an integration switch having one input and two outputs, a selector switch having one output and two inputs respectively connected to the two outputs of the integration switch, two integration capacitors provided between the ground and each of the two outputs of the integration switch, and a discharge switch provided between the ground and the one output of the selector switch; a second switched capacitor circuit having a plurality of circuits connected in parallel with each other, the plurality of circuits each including a corresponding one of a plurality of charge sharing switches and a corresponding one of a plurality of charge sharing capacitors provided between the ground and an output of each of the plurality of charge sharing switches, in which inputs of the plurality of charge sharing switches are commonly connected to an output of the first switched capacitor circuit, and at least one of outputs of the plurality of charge sharing switches is used as an output of the second switched capacitor circuit; and a time control section operable to output an integration control signal used for controlling an operation time of the integration switch, a switch control signal used for controlling an operation time of the selector switch, a discharge control signal used for controlling an operation time of the discharge switch, and charge sharing control signals used for controlling operation times of the plurality of charge sharing switches, in which the first switched capacitor circuit simultaneously performs both an operation of charging one of the two integration capacitors with an input signal in accordance with the integration control signal, and an operation of outputting, in accordance with the switch control signal, a charge of the other of the two integration capacitors having been charged, and discharging, in accordance with the discharge control signal, a residual charge of the other of the two integration capacitors having been discharged, and changes between the one of the two integration capacitors and the other thereof at intervals of a predetermined time period, so as to output a discrete time sample stream of the input signal to the second switched capacitor circuit; the second switched capacitor circuit receives the discrete time sample stream, and controls the plurality of charge sharing switches so as to be ON-OFF in accordance with the charge sharing control signals, such that an output signal is outputted; each of a time period during which each of the charge sharing control signals, the switch control signal, and the discharge control signal is at a high level and a time period during which each of the charge sharing control signals, the switch control signal, and the discharge control signal is at a low level is longer than or equal to a time period which corresponds to half a cycle period of the integration control signal, and at least two of the plurality of charge sharing switches are each controlled so as to be ON-OFF at a different time once during the predetermined time period.

Further, each charge sharing switch may be controlled so as to be ON-OFF once during the predetermined time period.

Further, each charge sharing switch may be controlled so as to be ON-OFF once during a time period which is longer than or equal to twice the predetermined time period.

Further, at least one of the plurality of charge sharing switches may be controlled so as to be ON-OFF once during a time period which is longer than or equal to twice the predetermined time period, and the others of the plurality of charge sharing switches may be each controlled so as to be ON-OFF once during the predetermined time period.

Further, at least two of the plurality of charge sharing switches may be controlled so as to be simultaneously ON-OFF.

Further, the second switched capacitor circuit may use, as outputs, at least two of the outputs of the plurality of charge sharing switches.

The present invention is also directed to a differential mixer. In order to attain the object mentioned above, the differential mixer according to the present invention includes any two of the mixers of the present invention described above, and is operable to perform a differential operation.

As described above, according to the present invention, the mixer which has a frequency selection function and uses the sampling technique is able to realize a high-order IIR filter characteristic with pass loss reduced in a circuit of a reduced scale, as compared to a conventional art. Thus, for example, a radio communication device allows a necessary amplification degree to be minimized, and also allows a circuit scale and consumption of current to be reduced.

Further, according to the present invention, in the mixer which has the frequency selection function and uses the sampling technique, no interference from a circuit following the mixer is generated, and therefore the designing is facilitated, and further, a maximum frequency necessary for an operation may be lower than or equal to a sampling CLK necessary for charge sampling. Therefore, it is possible to realize a high-order IIR filter characteristic without using an operation control signal of a high frequency, thereby allowing a radio communication device and the like to reduce consumption of power.

Consequently, according to the present invention, it is possible to realize a mixer having a frequency selection function and an improved interfering wave elimination characteristic with reduced consumption of power at reduced cost, as compared to a conventional art.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
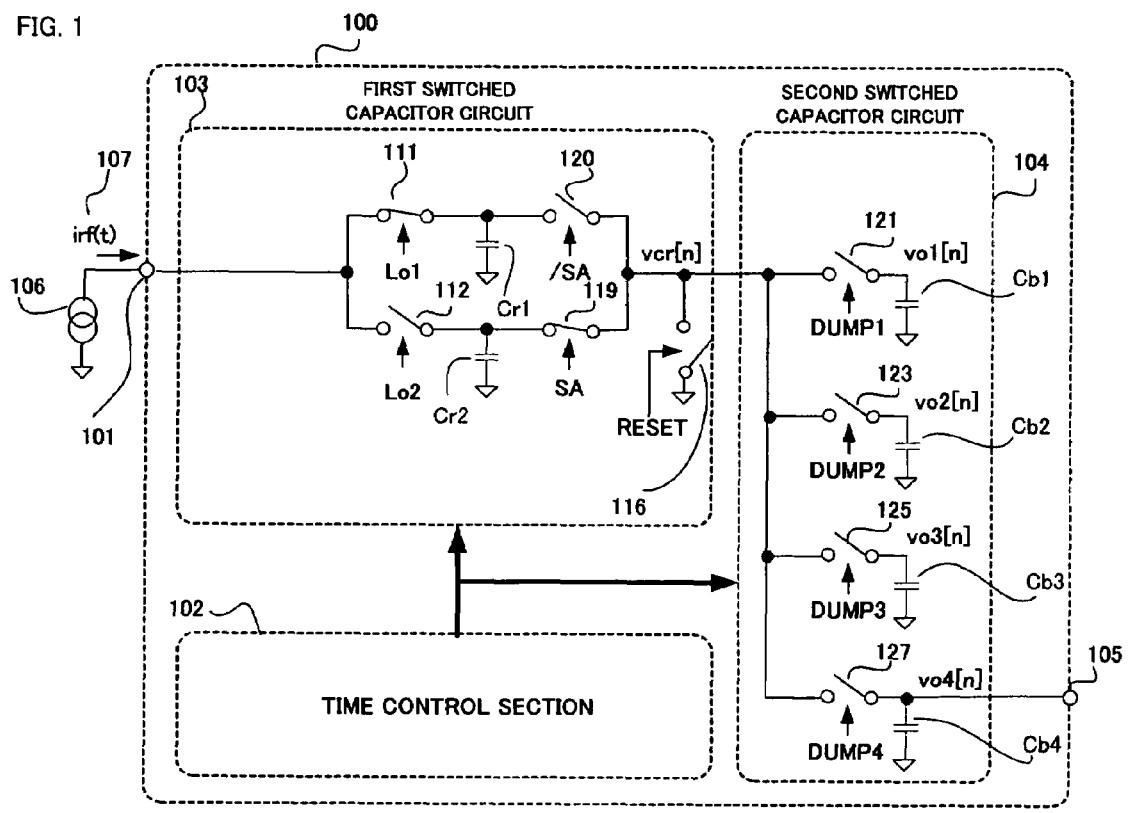
FIG. 1 is a diagram illustrating a structure of a mixer 100 having a frequency selection function of a first example according to a first embodiment of the present invention.

According to the present invention, a mixer having an enhanced frequency selection characteristic is realized, without increasing a frequency of an operation control signal, by operating a high-order IIR filter in accordance with an operation time for a circuit to which the charge sampling technique is applied. Hereinafter, embodiments of the mixer of the present invention will be described with reference to the drawings. The components common in each FIG. are denoted by the same reference numerals, and a repeated description is not given.

(1) FIRST EXAMPLE

FIG. 1 is a diagram illustrating a structure of a mixer 100 having a frequency selection function of a first example according to the first embodiment of the present invention. As shown in FIG. 1, the mixer 100 comprises an input terminal 101, a time control section 102, a first switched capacitor circuit 103, a second switched capacitor circuit 104, and an output terminal 105. An input of the first switched capacitor circuit 103 is connected to the input terminal 101, and an output thereof is connected to an input of the second switched capacitor circuit 104. Further, an output of the second switched capacitor circuit 104 is connected to the output terminal 105.

A signal source 106 is a signal source of a current output type. For example, when a signal source of a voltage output type, such as an antenna or a radio frequency amplifier, is used, it is necessary to convert a voltage signal into a current signal by using a transconductance amplifier of a well-known technique. Further, the first switched capacitor circuit 103 is a circuit using the charge sampling technique, and functions as a mixer having a frequency selection function. Further, the second switched capacitor circuit 104 is basically a high-order IIR filter described in David L. Fried, "Analog Sampled-Data Filters)", IEEE Journal of Solid-State Circuits, August, 1972.

The first switched capacitor circuit 103 includes integration operation switches 111 and 112, a discharge operation switch 116, selector switches 119 and 120, and integration capacitors Cr1 and Cr2. Inputs of the integration operation switches 111 and 112 are connected to the input terminal 101. An output of the integration operation switch 111 is connected to an input of the selector switch 120. Similarly, an output of the integration operation switch 112 is connected to an input of the selector switch 119. The integration capacitor Cr1 is connected between and in parallel with the integration operation switch 111 and the selector switch 120. Similarly, the integration capacitor Cr2 is connected between and in parallel with the integration operation switch 112 and the selector switch 119. Each of the integration capacitor Cr1 and the integration capacitor Cr2 is grounded at one end thereof. The outputs of the selector switch 120 and the selector switch 119 are combined with each other as an output of the first switched capacitor circuit 103. An input of the discharge operation switch 116 is connected in parallel with outputs of the selector switch 120 and the selector switch 119, and an output of the discharge operation switch 116 is grounded.

The second switched capacitor circuit 104 includes charge sharing switches 121, 123, 125, and 127, and charge sharing capacitors Cb1, Cb2, Cb3, and Cb4. Inputs of the charge sharing switches 121, 123, 125, and 127 are combined with each other as an input of the second switched capacitor circuit 104. An output of the charge sharing switch 121 is connected to one end of the charge sharing capacitor Cb1. The charge sharing capacitor Cb1 is grounded at the other end. Similarly, an output of the charge sharing switch 123 is connected to one end of the charge sharing capacitor Cb2. The charge sharing capacitor Cb2 is grounded at the other end. Further, an output of the charge sharing switch 125 is connected to one end of the charge sharing capacitor Cb3. The charge sharing capacitor Cb3 is grounded at the other end. Furthermore, an output of the charge sharing switch 127 is connected to one end of the charge sharing capacitor Cb4. The charge sharing capacitor Cb4 is grounded at the other end. The output of the charge sharing switch 127 is used as an output of the second switched capacitor circuit 104 and connected to the output terminal 105. That is, the second switched capacitor circuit 104 is structured such that sampling circuits each of which has the switch and the capacitor are connected in parallel with each other.

Figure 2:
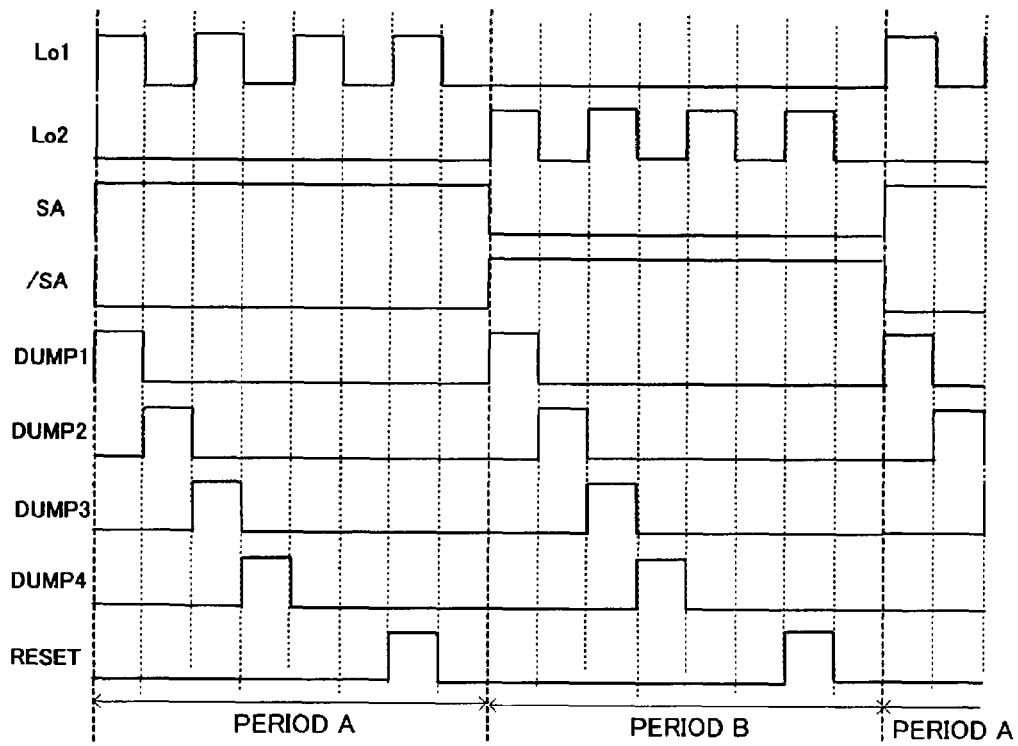
FIG. 2 is a timing chart of an operation control signal of the first example according to the first embodiment of the present invention.

FIG. 2 shows a timing chart of an operation control signal of the first example according to the first embodiment of the present invention. The timing chart shown in FIG. 2 indicates that period A and period B are alternately repeated. Further, integration operation control signals Lo1 and Lo2, discharge operation control signal RESET, switch operation control signals SA117 and /SA118, and charge sharing operation control signals DUMP1, DUMP2, DUMP3, and DUMP4, which are shown in FIG. 2, are outputted by the time control section 102. An operation of the integration operation switch 111 is controlled in accordance with the integration operation control signal Lo1; an operation of the integration operation switch 112 is controlled in accordance with the integration operation control signal Lo2; an operation of the discharge operation switch 116 is controlled in accordance with the discharge operation control signal RESET; an operation of the selector switch 119 is controlled in accordance with the switch operation control signal SA; an operation of the selector switch 120 is controlled in accordance with the switch operation control signal /SA; an operation of the charge sharing switch 121 is controlled in accordance with the charge sharing operation control signal DUMP1; an operation of the charge sharing switch 123 is controlled in accordance with the charge sharing operation control signal DUMP2; an operation of the charge sharing switch 125 is controlled in accordance with the charge sharing operation control signal DUMP3; and an operation of the charge sharing switch 127 is controlled in accordance with the charge sharing operation control signal DUMP4. Further, when each of the operation control signals as described above is at a high level, a corresponding switch is ON, whereas when each of the operation control signals as described above is at a low level, a corresponding switch is OFF. Hereinafter, an operation of the mixer 100 will be described with reference to FIGS. 1 and 2.

Firstly, an operation of the first switched capacitor circuit 103 will be described. Initially, an operation performed during period A shown in FIG. 2 will be described. As shown in FIG. 2, during period A, the integration operation switch 111 is periodically switched ON-OFF four times in accordance with the integration operation control signal Lo1. Further, the integration operation switch 112 is OFF in accordance with the integration operation control signal Lo2. Further, the selector switch 119 is ON in accordance with the switch operation control signal SA. Further, the selector switch 120 is OFF in accordance with the switch operation control signal /SA. The discharge operation switch 116 is ON during only a final ON period of the integration operation switch 111 in accordance with the discharge operation control signal RESET. Thus, the first switched capacitor circuit 103 (see FIG. 1) charges the integration capacitor Cr1 with a signal current irf(t) 107 for a predetermined time period. On the other hand, the first switched capacitor circuit 103 outputs, as a discrete time sample stream vcr[n], a terminal voltage of the integration capacitor Cr2 having been charged for a predetermined charging time period. Here, n is an integer representing a number of a discrete signal outputted by the first switched capacitor circuit 103. After this output ends, residual charge of the integration capacitor Cr2 is reset (discharged) by the discharge operation switch 116 being ON.

Next, an operation performed during period B shown in FIG. 2 will be described. As shown in FIG. 2, during period B, the integration operation switch 111 is OFF in accordance with the integration operation control signal Lo1. Further, the integration operation switch 112 is periodically switched ON-OFF four times in accordance with the integration operation control signal Lo2. Further, the selector switch 119 is OFF in accordance with the switch operation control signal SA. Further, the selector switch 120 is ON in accordance with the switch operation control signal /SA. The discharge operation switch 116 is ON during only a final ON period of the integration operation switch 112 in accordance with the discharge operation control signal RESET. Thus, the first switched capacitor circuit 103 outputs, as a discrete time sample stream vcr[n], a terminal voltage of the integration capacitor Cr1 having been charged for a predetermined charging time period. After this output ends, residual charge of the integration capacitor Cr1 is reset (discharged) by the discharge operation switch 116 being ON. On the other hand, the first switched capacitor circuit 103 charges the integration capacitor Cr2 with a signal current irf(t) 107 for a predetermined time period.

In the above description for period A and period B, the predetermined time period for charging the signal current irf(t) 107 is, for example, a time period corresponding to four cycles of the periodic ON-OFF operation performed by the integration operation switch 111 or the integration operation switch 112.

The first switched capacitor circuit 103 processes, by alternately repeating the operation performed during period A and the operation performed during period B, the signal current irf(t) 107 supplied from the signal source 106 through the input terminal 101 so as to generate the discrete time sample stream vcr[n]. The first switched capacitor circuit 103 includes two integration capacitors (Cr1 and Cr2) so as to charge the integration capacitor and simultaneously output the discrete time sample stream vcr[n] to the second switched capacitor circuit. Further, the first switched capacitor circuit 103 is structured such that the selector switches 119 and 120 are controlled in accordance with the switch operation control signals SA and /SA, respectively, having phases inversed with respect to each other, so as to change a connection path to be connected with the second switched capacitor circuit 104.

Next, an operation of the second switched capacitor circuit 104 will be described. Initially, an operation performed during period A shown in FIG. 2 will be described. As shown in FIG. 2, the charge sharing operation control signal DUMP1 is at the high level during a high level period of a first ON-OFF (high level-low level) cycle of the integration operation control signal Lo1. Thus, the charge sharing switch 121 is ON, and therefore a charge of the integration capacitor Cr2 and a charge of the charge sharing capacitor Cb1 are shared by the integration capacitor Cr2 and the charge sharing capacitor Cb1 (see FIG. 1). Next, the charge sharing operation control signal DUMP2 is at the high level during a low level period of the first ON-OFF cycle of the integration operation control signal Lo1. Thus, the charge sharing switch 123 is ON, and therefore a charge of the integration capacitor Cr2 and a charge of the charge sharing capacitor Cb2 are shared by the integration capacitor Cr2 and the charge sharing capacitor Cb2. Next, the charge sharing operation control signal DUMP3 is at the high level during a high level period of a second ON-OFF cycle of the integration operation control signal Lo1. Thus, the charge sharing switch 125 is ON, and therefore a charge of the integration capacitor Cr2 and a charge of the charge sharing capacitor Cb3 are shared by the integration capacitor Cr2 and the charge sharing capacitor Cb3. Next, the charge sharing operation control signal DUMP4 is at the high level during a low level period of the second ON-OFF cycle of the integration operation control signal Lo1. Thus, the charge sharing switch 127 is ON, and therefore a charge of the integration capacitor Cr2 and a charge of the charge sharing capacitor Cb4 are shared by the integration capacitor Cr2 and the charge sharing capacitor Cb4. A charge shared by the integration capacitor Cr2 and the charge sharing capacitor Cb4 is used as an output of the second switched capacitor circuit 104 (an output of the mixer 100). Thereafter, as described above, the discharge operation control signal RESET is at the high level during a given time period, whereby a charge of the integration capacitor Cr2 is reset (discharged).

Next, an operation performed during period B shown in FIG. 2 will be described. As shown in FIG. 2, the charge sharing operation control signal DUMP1 is at the high level during a high level period of a first ON-OFF cycle of the integration operation control signal Lo2. Thus, the charge sharing switch 121 is ON, and therefore a charge of the integration capacitor Cr1 and a charge of the charge sharing capacitor Cb1 are shared by the integration capacitor Cr1 and the charge sharing capacitor Cb1 (see FIG. 1). Next, the charge sharing operation control signal DUMP2 is at the high level during a low level period of the first ON-OFF cycle of the integration operation control signal Lo2. Thus, the charge sharing switch 123 is ON, and therefore a charge of the integration capacitor Cr1 and a charge of the charge sharing capacitor Cb2 are shared by the integration capacitor Cr1 and the charge sharing capacitor Cb2. Next, the charge sharing operation control signal DUMP3 is at the high level during a high level period of a second ON-OFF cycle of the integration operation control signal Lo2. Thus, the charge sharing switch 125 is ON, and therefore a charge of the integration capacitor Cr1 and a charge of the charge sharing capacitor Cb3 are shared by the integration capacitor Cr1 and the charge sharing capacitor Cb3. Next, the charge sharing operation control signal DUMP4 is at the high level during a low level period of the second ON-OFF cycle of the integration operation control signal Lo2. Thus, the charge sharing switch 127 is ON, and therefore a charge of the integration capacitor Cr1 and a charge of the charge sharing capacitor Cb4 are shared by the integration capacitor Cr1 and the charge sharing capacitor Cb4. A charge shared by the integration capacitor Cr1 and the charge sharing capacitor Cb4 is used as an output of the second switched capacitor circuit 104 (an output of the mixer 100). Thereafter, as described above, the discharge operation control signal RESET is at the high level during a given time period, whereby a charge of the integration capacitor Cr1 is reset (discharged). The second switched capacitor circuit 104 alternately performs the operation for period A and the operation for period B as described above.

As described above, the second switched capacitor circuit 104 controls ON-OFF operations of the charge sharing switches 121, 123, 125, and 127 in accordance with the charge sharing operation control signals DUMP1, DUMP2, DUMP3, and DUMP4, respectively, which are supplied by the time control section 102. Thus, the second switched capacitor circuit 104 processes the discrete time sample stream vcr[n] corresponding to an output of the first switched capacitor circuit 103, and outputs the processed discrete time sample stream to the output terminal 105.

As shown in FIG. 2, each of a time period during which each of the charge sharing operation control signals DUMP1, DUMP2, DUMP3, and DUMP4 is at the high level and a time period during which each of the charge sharing operation control signals DUMP1, DUMP2, DUMP3, and DUMP4 is at the low level may be longer than or equal to a time period during which each of the integration operation control signals Lo1 and Lo2 supplied to the first switched capacitor circuit 103 is at the high level or at the low level. That is, the time control section 102 is not required to output an operation control signal having an operating frequency higher than an operating frequency of each of the integration operation control signals Lo1 and Lo2. Thus, it is possible to realize a high-order IIR filter without enhancing an operating frequency necessary for driving the mixer 100 so as to be higher than an operating frequency of each of the integration operation control signals Lo1 and Lo2. In other words, it is possible to increase the order of the IIR filter by using a minimum operating frequency necessary for driving the mixer 100.

In order to further increase the order of the IIR filter, the number of sampling circuits each including the charge sharing switch and the charge sharing capacitor may be increased. Further, as the switches such as the integration operation switch 111 and the charge sharing switch 121, well-known analog switches (for example, switch using MOSFET) may be used. Further, the time control section 102 may be a logic circuit, and a maximum frequency for driving the logic circuit may be a frequency of each of the integration operation control signals Lo1 and Lo2, which correspond to a sampling CLK signal.

Next, the high-order IIR filter characteristic of the mixer 100 having the frequency selection function of the first example according to the first embodiment of the preset invention will be described with reference to FIGS. 1 and 2. The IIR filter characteristic depends on a charge shared by the integration capacitor Cr1 or Cr2 holding the discrete time sample stream vcr[n] corresponding to an output of the first switched capacitor circuit 103, and the charge sharing capacitors Cb1, Cb2, Cb3, or Cb4 of the second switched capacitor circuit 104. Hereinafter, a charge sharing operation performed by the integration capacitor Cr2, and the charge sharing capacitors Cb1, Cb2, Cb3, and Cb4, will be described.

Initially, the integration capacitor Cr2 and the charge sharing capacitor Cb1 are connected to each other by the charge sharing switch 121, so that the two capacitors share a charge. Thus, a discrete time signal vo1[n] having first-order IIR characteristic can be obtained. Next, the charge sharing switch 121 is switched OFF, and thereafter the charge sharing capacitor Cb2 and the integration capacitor Cr2 holding the discrete time signal vo1[n] obtained by the charge sharing with the charge sharing capacitor Cb1 are connected to each other by the charge sharing switch 123. Thus, filter characteristic obtained by charge sharing between the integration capacitor Cr2 and the charge sharing capacitor Cb2 represents first-order IIR filter characteristic twice, that is, represents a second-order IIR filter characteristic obtained by cascading the first-order IIR filters. Similarly, it is possible to obtain a third-order IIR filter characteristic by charge sharing between the integration capacitor Cr2 and the charge sharing capacitor Cb3, and it is possible to obtain a fourth-order IIR filter characteristic by charge sharing between the integration capacitor Cr2 and the charge sharing capacitor Cb4.

Here, discrete time signals obtained, through the charge sharing described above, by the charge sharing capacitors Cb1, Cb2, Cb3, and Cb4 are represented by vo1[n], vo2[n], vo3[n], and vo4[n], respectively. Here, n is an integer representing a number of a discrete signal outputted by the first switched capacitor circuit 103. Further, capacities of the charge sharing capacitors Cr2 and Cr1 are equal to each other and are each represented by Cr, a capacity of the charge sharing capacitor Cb1 is represented by Cb1, a capacity of the charge sharing capacitor Cb2 is represented by Cb2, a capacity of the charge sharing capacitor Cb3 is represented by Cb3, and a capacity of the charge sharing capacitor Cb4 is represented by Cb4. In this case, relationships between the respective discrete time signals and the discrete time sample stream vcr[n] corresponding to an output of the first switched capacitor circuit 103 satisfy equations 1 to 4:

[Equation 1]

$$(Cr+Cb1) \cdot vo1[n] = Cr \cdot vcr[n] + Cb1 \cdot vo1[n-1] \quad (1)$$

[Equation 2]

$$(Cr+Cb2) \cdot vo2[n] = Cr \cdot vo1[n] + Cb2 \cdot vo2[n-1] \quad (2)$$

[Equation 3]

$$(Cr+Cb3) \cdot vo3[n] = Cr \cdot vo2[n] + Cb3 \cdot vo3[n-1] \quad (3)$$

[Equation 4]

$$(Cr+Cb4) \cdot vo4[n] = Cr \cdot vo3[n] + Cb4 \cdot vo4[n-1] \quad (4)$$

When z-transform is performed in equations 1 to 4, transfer functions $H1(z)$, $H2(z)$, $H3(z)$, and $H4(z)$ between discrete time signals vo1[n], vo2[n], vo3[n], and vo4[n] obtained by the respective charge sharing capacitors Cb1 to Cb4, and the discrete time sample stream vcr[n] corresponding to the output of the first switched capacitor circuit 103 can be obtained in accordance with equations 5 to 8, respectively.

[Equation 5]

$$H1(z) = \frac{Cr}{Cr + Cb1 - Cb1 \cdot z^{-1}} \quad (5)$$

[Equation 6]

$$H2(z) = \frac{Cr}{Cr + Cb1 - Cb1 \cdot z^{-1}} \cdot \frac{Cr}{Cr + Cb2 - Cb2 \cdot z^{-1}} \quad (6)$$

[Equation 7]

$$H3(z) = \frac{Cr}{Cr + Cb1 - Cb1 \cdot z^{-1}} \cdot \frac{Cr}{Cr + Cb2 - Cb2 \cdot z^{-1}} \cdot \frac{Cr}{Cr + Cb3 - Cb3 \cdot z^{-1}} \quad (7)$$

[Equation 8]

$$H4(z) = \frac{Cr}{Cr + Cb1 - Cb1 \cdot z^{-1}} \cdot \frac{Cr}{Cr + Cb2 - Cb2 \cdot z^{-1}} \cdot \frac{Cr}{Cr + Cb3 - Cb3 \cdot z^{-1}} \cdot \frac{Cr}{Cr + Cb4 - Cb4 \cdot z^{-1}} \quad (8)$$

Figure 3:
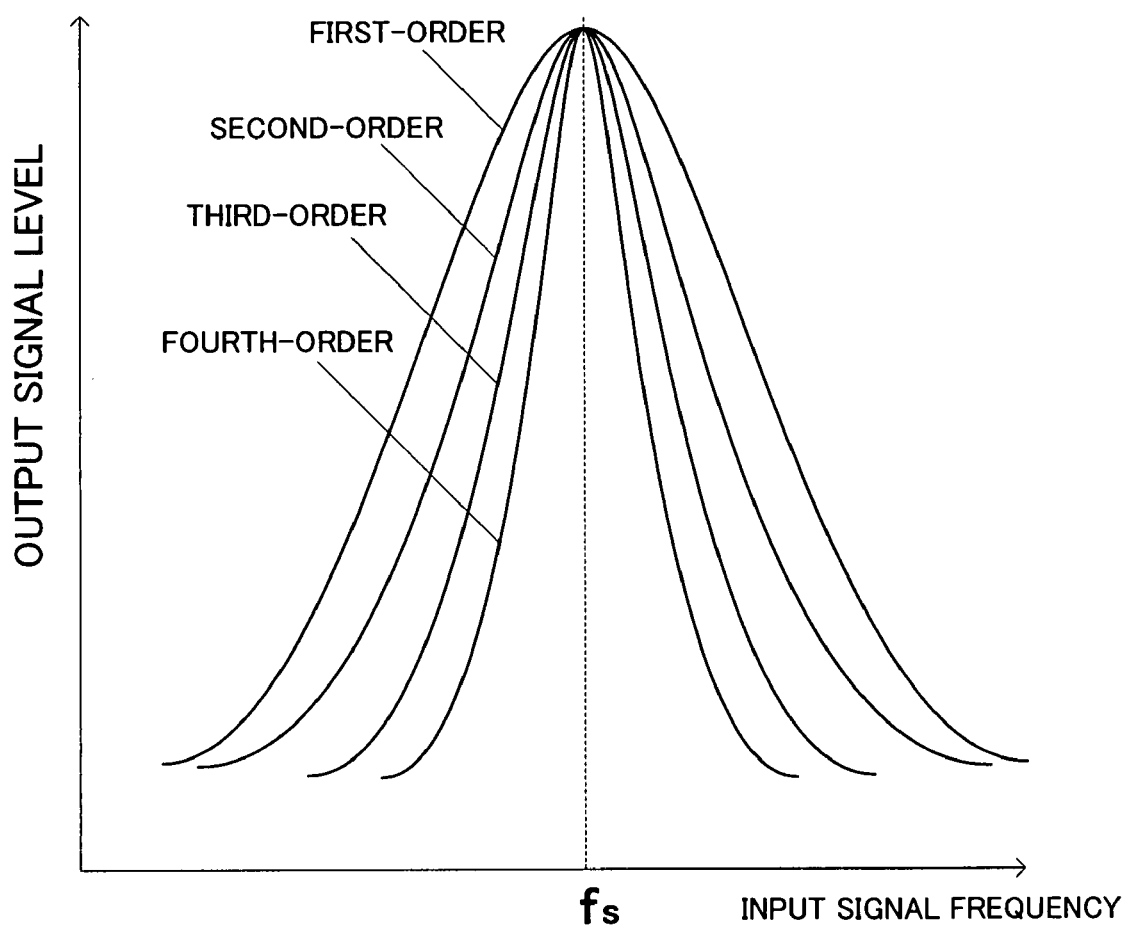
FIG. 3 is a conceptual diagram illustrating a pass loss in a signal passband of the mixer 100 having the frequency selection function of the first example according to the first embodiment of the present invention.
Figure 13:
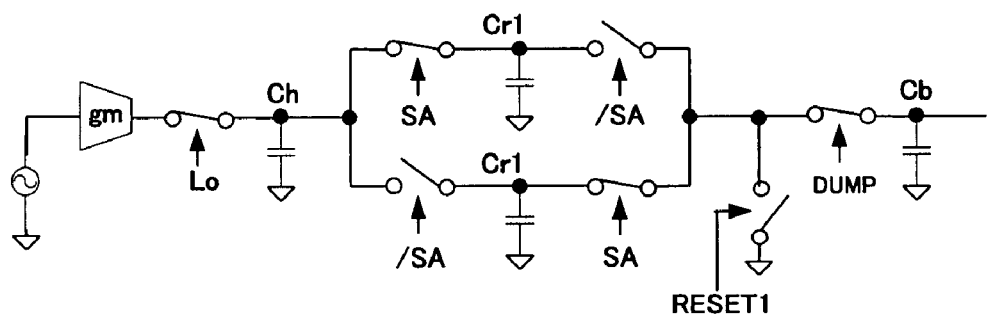
FIG. 13 is a diagram illustrating a conventional circuit in which the charge sampling technique is applied to a mixer having a frequency selection characteristic so as to increasingly enhance the frequency selection characteristic of the mixer.
Figure 14:
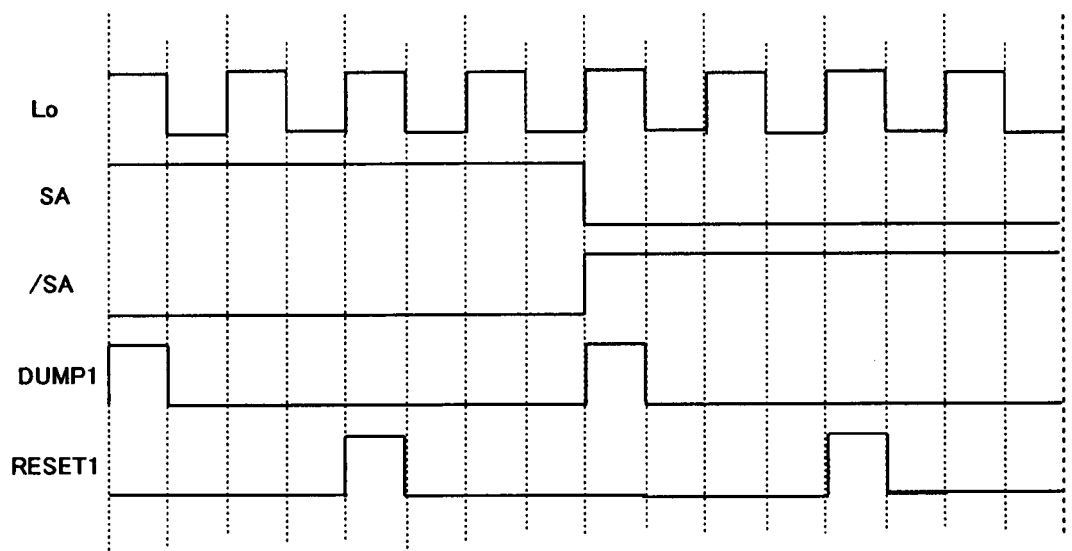
FIG. 14 is a timing chart of an operation control signal used for the circuit shown in FIG. 13.
Figure 15:
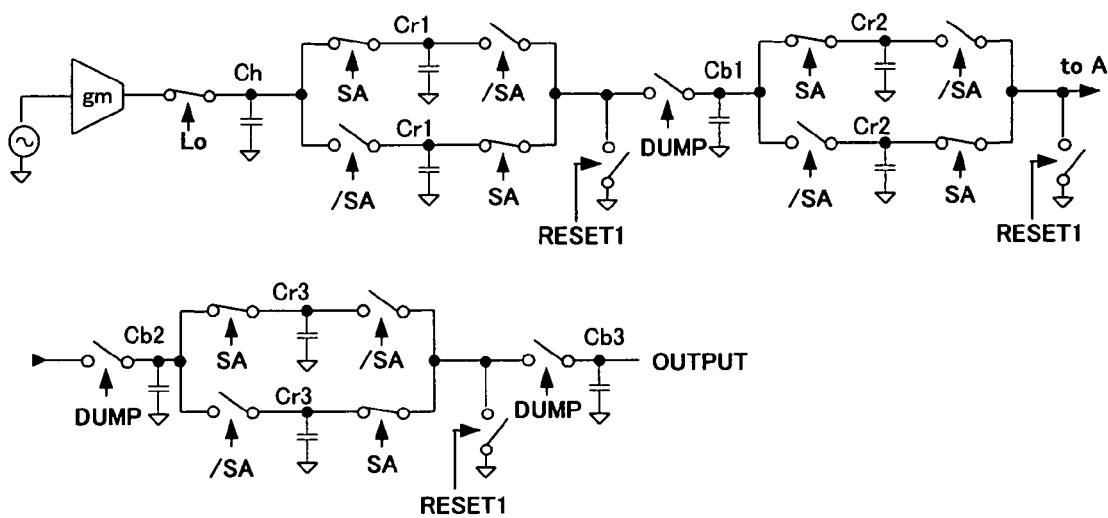
FIG. 15 is a diagram illustrating a conventional circuit in which the circuits shown in FIG. 13 are cascaded so as to increase the order.
Figure 16:
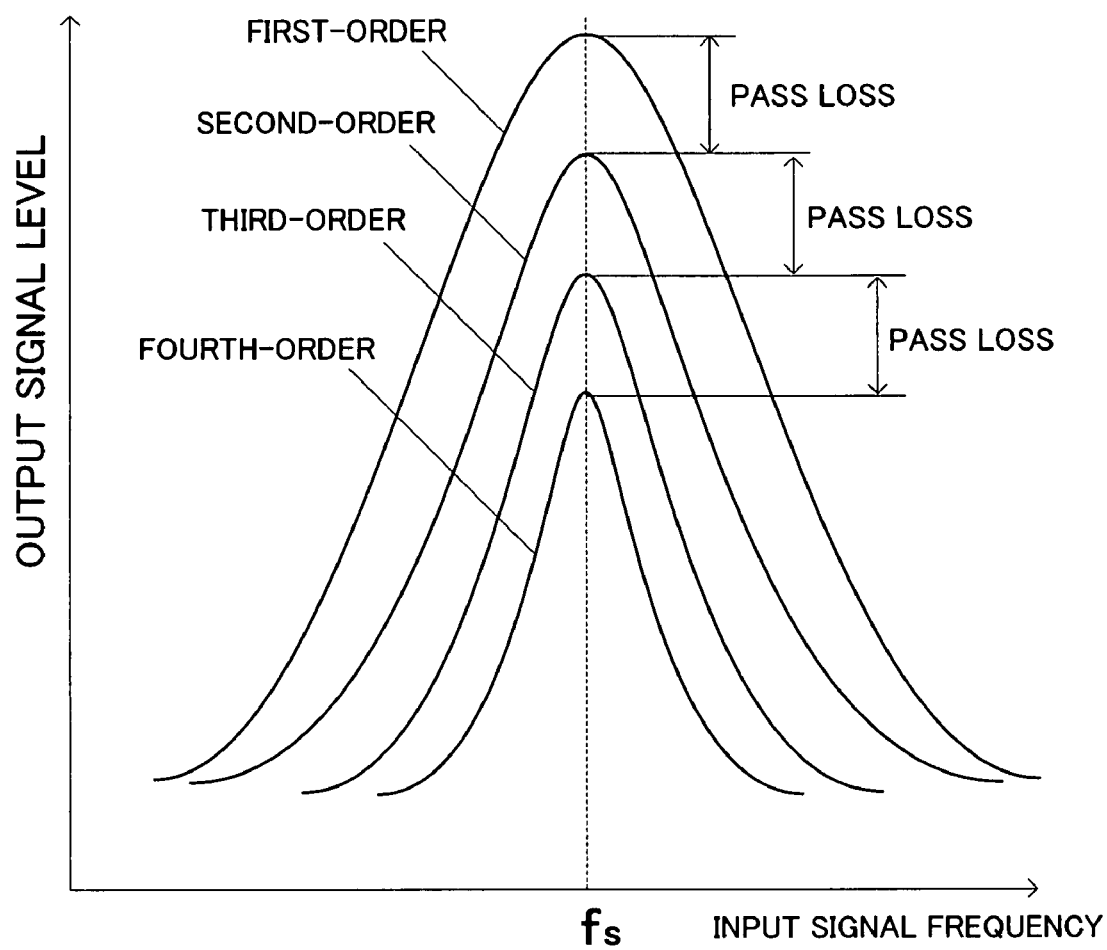
FIG. 16 is a conceptual diagram illustrating a pass loss occurring in a signal passband according to a conventional art.

According to equations 5 to 8, a high-order IIR filter in which no pass loss occurs in a signal passband is realized. FIG. 3 is a conceptual diagram illustrating the pass loss in the signal passband of the mixer 100 having the frequency selection function of the first example according to the first embodiment of the present invention. As shown in FIG. 3, in the mixer 100, no pass loss occurs at a sampling frequency fs in the signal passband, unlike in the conventional art shown in FIG. 13.

As described above, in the first example according to the first embodiment of the present invention, the charge sharing switches 121, 123, 125, and 127 are each controlled so as to be ON-OFF at a different time once during a predetermined time period (period A, period B) in accordance with the charge sharing operation control signals DUMP1, DUMP2, DUMP3, and DUMP4, respectively, supplied by the time control section 102. Thus, in the first example according to the first embodiment of the present invention, it is possible to realize a mixer having an enhanced frequency selection function and a high-order IIR filter characteristic in which no pass loss occurs in the signal passband, without enhancing an operating frequency necessary for driving a circuit so as to be higher than the sampling CLK.

(2) SECOND EXAMPLE

Figure 4:
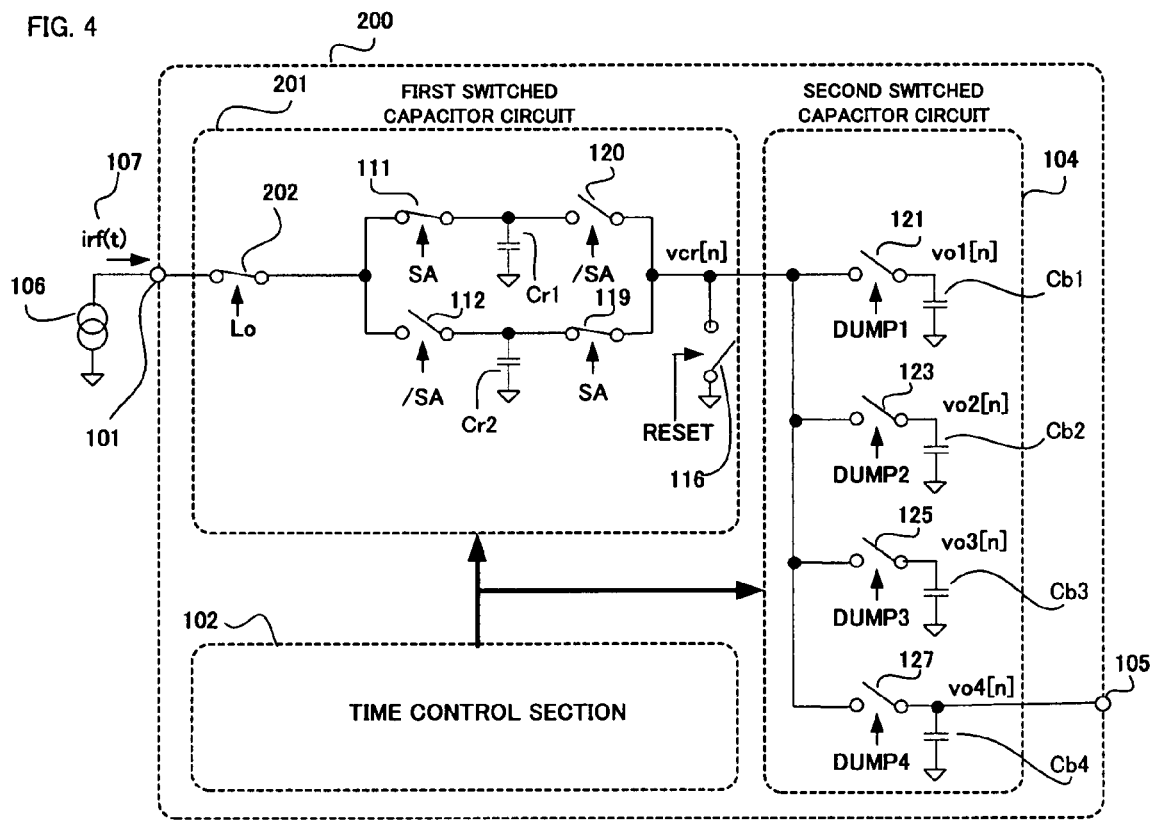
FIG. 4 is a diagram illustrating a structure of a mixer 200 having a frequency selection function of a second example according to the first embodiment of the present invention.

FIG. 4 is a diagram illustrating a structure of a mixer 200 having a frequency selection function of a second example according to the first embodiment of the present invention. The mixer 200 shown in FIG. 4 is the same as the mixer 100 shown in FIG. 1 (first example) except for a configuration of the first switched capacitor circuit 201. The first switched capacitor circuit 201 is configured such that an integration operation switch 202 and the integration operation control signal Lo are added to the first switched capacitor circuit 103 shown in FIG. 1, and the switch operation control signals SA and /SA are used as the operation control signals for the integration operation switches 111 and 112, respectively.

Figure 5:
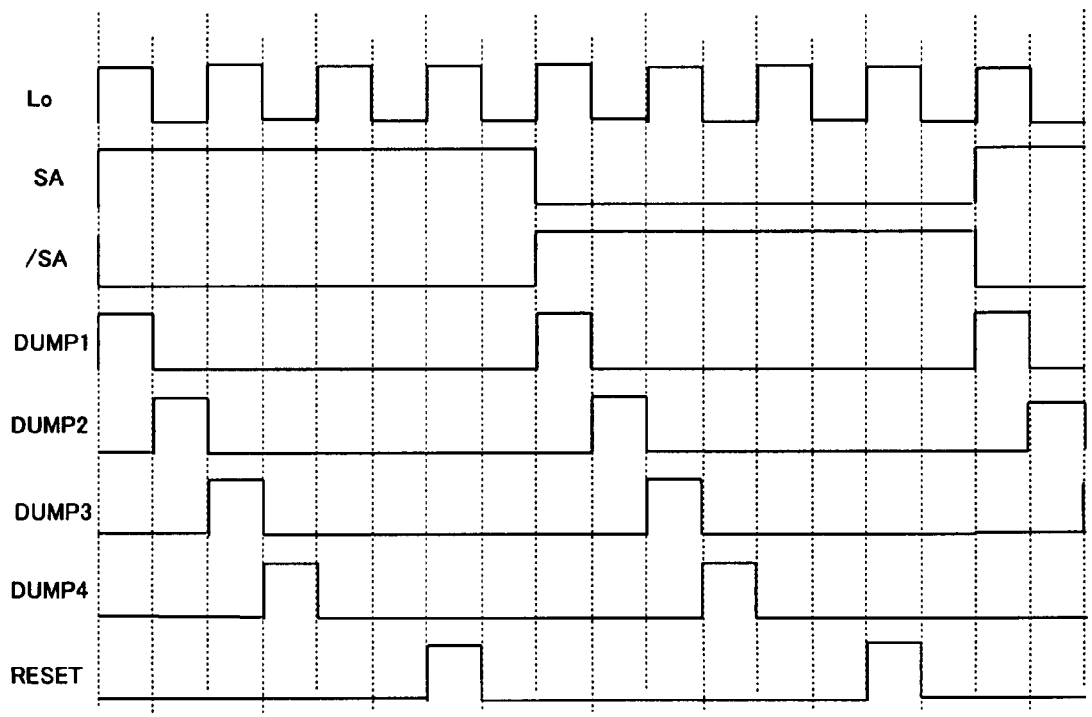
FIG. 5 is a timing chart of an operation control signal of the second example according to the first embodiment of the present invention.

FIG. 5 shows a timing chart of an operation control signal of the second example according to the first embodiment of the present invention. The timing chart shown in FIG. 5 is the same as the timing chart (of the first example) shown in FIG. 2 except that in the timing chart shown in FIG. 5 the integration operation control signal Lo is used instead of the integration operation control signals Lo1 and Lo2.

That is, the first switched capacitor circuit 201 shown in FIG. 4 performs the integration operation by using the integration operation switch 202, the integration operation control signal Lo, the integration operation switches 111 and 112, and the switch operation control signals SA and /SA, unlike the first switched capacitor circuit 103 shown in FIG. 1.

As described above, the first switched capacitor circuit may not necessarily have the configurations shown in FIG. 1 (first example) and FIG. 4 (second example), and may have any configuration in which the charge sampling technique is used, and the integration operation is repeated over multiple cycles of the integration operation control signal. For example, the first switched capacitor circuit may have a configuration (not shown) as disclosed in U.S. Pat. No. 5,414, 311. That is, a capacitor may be additionally provided between the integration operation switch 202 and the integration operation switches 111 and 112. This configuration allows a first-order IIR characteristic to be added as described in U.S. Pat. No. 5,414,311.

(3) THIRD EXAMPLE

Figure 6:
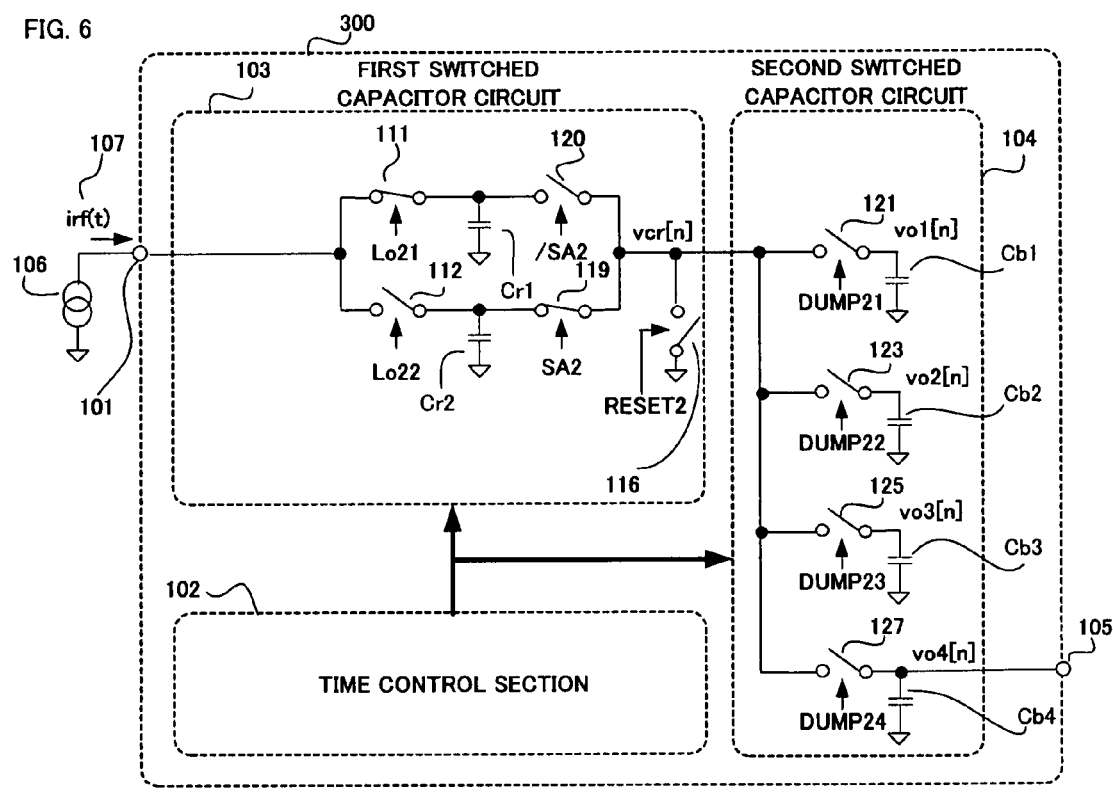
FIG. 6 is a diagram illustrating a structure of a mixer 300 having a frequency selection function of a third example according to the first embodiment of the present invention.
Figure 7:
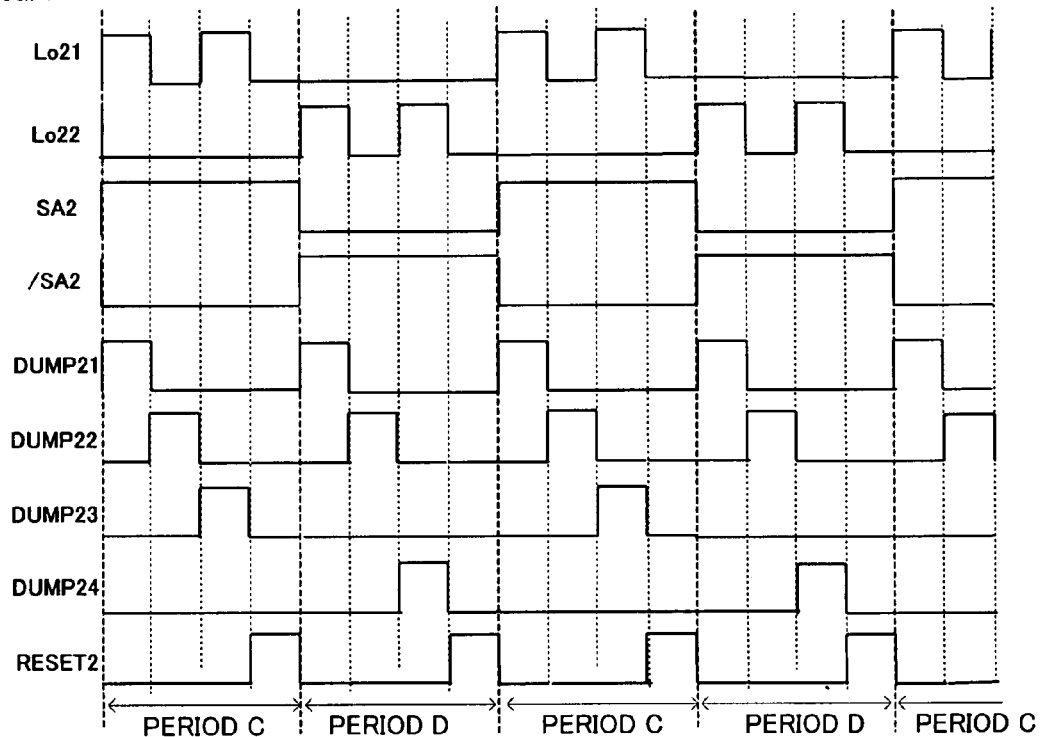
FIG. 7 is a timing chart of an operation control signal of the third example according to the first embodiment of the present invention.

FIG. 6 is a diagram illustrating a structure of a mixer 300 having a frequency selection function of a third example according to the first embodiment of the present invention. FIG. 7 shows a timing chart of an operation control signal of the third example according to the first embodiment of the present invention. As shown in FIG. 6, the mixer 300 has the same structure as the mixer 100 of the first example (see FIG. 1). However, the timing chart (see FIG. 7) of the operation control signal for the mixer 300 is different from the timing chart (see FIG. 2) of the operation control signal for the mixer 100, so that the mixer 300 performs an operation different from the mixer 100.

The timing chart shown in FIG. 7 indicates that period C and period D, each of which corresponds to a predetermined time period, are alternately repeated. Further, integration operation control signals Lo21 and Lo22, switch operation control signals SA2 and /SA2, a discharge operation control signal RESET2, charge sharing operation control signals DUMP21, DUMP22, DUMP23, and DUMP24, which are shown in FIG. 7, are signals outputted by the time control section 102. An operation of the integration operation switch 111 is controlled in accordance with the integration operation control signal Lo21; an operation of the integration operation switch 112 is controlled in accordance with the integration operation control signal Lo22; an operation of the selectors switch 119 is controlled in accordance with the switch operation control signal SA2; an operation of the selector switch 120 is controlled in accordance with the switch operation control signal /SA2; an operation of the discharge operation switch 116 is controlled in accordance with the discharge operation control signal RESET2; an operation of the charge sharing switch 121 is controlled in accordance with the charge sharing operation control signal DUMP21; an operation of the charge sharing switch 123 is controlled in accordance with the charge sharing operation control signal DUMP22; an operation of the charge sharing switch 125 is controlled in accordance with the charge sharing operation control signal DUMP23; and an operation of the charge sharing switch 127 is controlled in accordance with the charge sharing operation control signal DUMP24. Further, when each of these operation control signals is at a high level, a corresponding switch is ON, whereas when each of these operation control signals is at a low level, a corresponding switch is OFF. Hereinafter, an operation of the mixer 300 will be described with reference to FIGS. 6 and 7.

Firstly, an operation of the first switched capacitor circuit 103 will be described. Initially, an operation performed during period C shown in FIG. 7 will be described. As shown in FIG. 7, during period C, the integration operation switch 111 is periodically switched ON-OFF twice in accordance with the integration operation control signal Lo21. Further, the integration operation switch 112 is OFF in accordance with the integration operation control signal Lo22. Further, the selector switch 119 is ON in accordance with the switch operation control signal SA2. Further, the selector switch 120 is OFF in accordance with the switch operation control signal /SA2. The discharge operation switch 116 is ON during only a final OFF period of the integration operation switch 111 in accordance with the discharge operation control signal RESET2. Thus, the first switched capacitor circuit 103 (see FIG. 6) charges the integration capacitor Cr1 with a signal current irf(t) (107) during a predetermined time period. On the other hand, the first switched capacitor circuit 103 outputs, as a discrete time sample stream vcr[n], a terminal voltage of the integration capacitor Cr2 having been charged for a predetermined charging time period. Here, n is an integer representing a number of a discrete signal outputted by the first switched capacitor circuit 103. After this output ends, residual charge of the integration capacitor Cr2 is reset (discharged) by the discharge operation switch 116 being ON.

Next, an operation performed during period D shown in FIG. 7 will be described. As shown in FIG. 7, during period D, the integration operation switch 111 is OFF in accordance with the integration operation control signal Lo21. Further, the integration operation switch 112 is periodically switched ON-OFF twice in accordance with the integration operation control signal Lo22. Further, the selector switch 119 is OFF in accordance with the switch operation control signal SA2. Further, the selector switch 120 is ON in accordance with the switch operation control signal /SA2. The discharge operation switch 116 is ON during only a final OFF period of the integration operation switch 112 in accordance with the discharge operation control signal RESET2. Thus, the first switched capacitor circuit 103 outputs, as a discrete time sample stream vcr[n], a terminal voltage of the integration capacitor Cr1 having been charged for a predetermined charging time period. After this output ends, residual charge of the integration capacitor Cr1 is reset (discharged) by the discharge operation switch 116 being ON. On the other hand, the first switched capacitor circuit 103 charges the integration capacitor Cr2 with a signal current irf(t) 107 during a predetermined time period.

In the above description for period C and period D, the predetermined time period for charging the signal current irf(t) 107 is, for example, a time period corresponding to two cycles of periodic ON-OFF operation performed by the switches 111 and 112.

The first switched capacitor circuit 103 processes, by alternately repeating the operation performed during period C and the operation performed during period D, the signal current irf(t) 107 supplied from the signal source 106 through the input terminal 101 so as to generate the discrete time sample stream vcr[n].

Next, an operation of the second switched capacitor circuit 104 will be described. Initially, an operation performed during period C shown in FIG. 7 will be described. As shown in FIG. 7, the charge sharing operation control signal DUMP21 is at the high level during a high level period of a first ON-OFF (high level-low level) cycle of the integration operation control signal Lo21. Thus, the charge sharing switch 121 is ON, and therefore a charge of the integration capacitor Cr2 and a charge of the charge sharing capacitor Cb1 are shared by the integration capacitor Cr2 and the charge sharing capacitor Cb1 (see FIG. 6). Next, the charge sharing operation control signal DUMP22 is at the high level during a low level period of the first ON-OFF cycle of the integration operation control signal Lo21. Thus, the charge sharing switch 123 is ON, and therefore a charge of the integration capacitor Cr2 and a charge of the charge sharing capacitor Cb2 are shared by the integration capacitor Cr2 and the charge sharing capacitor Cb2. Next, the charge sharing operation control signal DUMP23 is at the high level during a high level period of a second ON-OFF cycle of the integration operation control signal Lo21. Thus, the charge sharing switch 125 is ON, and therefore a charge of the integration capacitor Cr2 and a charge of the charge sharing capacitor Cb3 are shared by the integration capacitor Cr2 and the charge sharing capacitor Cb3. Thereafter, as described above, the discharge operation control signal RESET2 is at the high level during a given time period, whereby a charge of the integration capacitor Cr2 is reset (discharged).

Next, an operation performed during period D shown in FIG. 7 will be described. As shown in FIG. 7, the charge sharing operation control signal DUMP21 is at the high level during a high level period of a first ON-OFF cycle of the integration operation control signal Lo22. Thus, the charge sharing switch 121 is ON, and therefore a charge of the integration capacitor Cr1 and a charge of the charge sharing capacitor Cb1 are shared by the integration capacitor Cr1 and the charge sharing capacitor Cb1 (see FIG. 6). Next, the charge sharing operation control signal DUMP22 is at the high level during a low level period of the first ON-OFF cycle of the integration operation control signal Lo22. Thus, the charge sharing switch 123 is ON, and therefore a charge of the integration capacitor Cr1 and a charge of the charge sharing capacitor Cb2 are shared by the integration capacitor Cr1 and the charge sharing capacitor Cb2. Next, the charge sharing operation control signal DUMP24 is at the high level during a high level period of a second ON-OFF cycle of the integration operation control signal Lo22. Thus, the charge sharing switch 127 is ON, and therefore a charge of the integration capacitor Cr1 and a charge of the charge sharing capacitor Cb4 are shared by the integration capacitor Cr1 and the charge sharing capacitor Cb4. A charge shared by the integration capacitor Cr1 and the charge sharing capacitor Cb4 is used as an output of the second switched capacitor circuit 104 (an output of the mixer 300). Thereafter, as described above, the discharge operation control signal RESET2 is at the high level during a given time period, whereby a charge of the integration capacitor Cr1 is reset (discharged). The second switched capacitor circuit 104 alternately performs the operation for period C and the operation for period D as described above.

As described above, the second switched capacitor circuit 104 controls ON-OFF operations of the charge sharing switches 121, 123, 125, and 127 in accordance with the charge sharing operation control signals DUMP21, DUMP22, DUMP23, and DUMP24, respectively, which are supplied by the time control section 102. Thus, the second switched capacitor circuit 104 processes the discrete time sample stream vcr[n] corresponding to an output of the first switched capacitor circuit 103, and outputs the processed discrete time sample stream to the output terminal 105.

As described above, in the third example according to the first embodiment of the present invention, it is possible to shorten the predetermined charging time period during which each of the integration capacitors Cr1 and Cr2 is charged as compared to those described for the first and the second examples (see FIG. 1, FIG. 2, FIG. 4, and FIG. 5). In the third example, the predetermined charging time period is, for example, a time period corresponding to two cycles of the periodic ON-OFF operation performed by the switches 111 and 112.

In addition, in the third example, for the same reason as described for the first example, the time control section 102 is not required to output an operation control signal having an operating frequency higher than an operating frequency of each of the integration operation control signals Lo21 and Lo22 (see FIG. 7). Thus, in the third example, it is possible to realize a high-order IIR filter without enhancing an operating frequency necessary for driving the mixer 300 so as to be higher than the operating frequency of each of the integration operation control signals Lo21 and Lo22, as in the first example.

Next, a high-order IIR filter characteristic of the mixer 300 having the frequency selection function of the third example according to the first embodiment of the preset invention will be described. As in the first example, discrete time signals obtained, through the charge sharing, by the charge sharing capacitors Cb1, Cb2, Cb3, and Cb4 are represented by vo1[n], vo2[n], vo3[n], and vo4[n], respectively. Further, capacities of the charge sharing capacitors Cr2 and Cr1 are equal to each other and are each represented by Cr, a capacity of the charge sharing capacitor Cb1 is represented by Cb1, a capacity of the charge sharing capacitor Cb2 is represented by Cb2, a capacity of the charge sharing capacitor Cb3 is represented by Cb3, and a capacity of the charge sharing capacitor Cb4 is represented by Cb4. In this case, relationships between the respective discrete time signals and the discrete time sample stream vcr[n] corresponding to an output of the first switched capacitor circuit 103 of the third example satisfy equations 9 to 12:

[Equation 9]

$$(Cr+Cb1)\cdot vo1[n] = Cr\cdot vcr[n] + Cb1\cdot vo1[n-1] \quad (9)$$

[Equation 10]

$$(Cr+Cb2)\cdot vo2[n] = Cr\cdot vo1[n] + Cb2\cdot vo2[n-1] \quad (10)$$

[Equation 11]

$$(Cr+Cb3)\cdot vo3[n] = Cr\cdot vo2[n] + Cb3\cdot vo3[n-2] \quad (11)$$

[Equation 12]

$$(Cr+Cb4)\cdot vo4[n-1] = Cr\cdot vo2[n-2] + Cb4\cdot vo4[n-3] \quad (12)$$

When z-transform is performed in equations 9 to 12, transfer functions H1(z), H2(z), H3(z), and H4(z) between discrete time signals vo1[n], vo2[n], vo3[n], and vo4[n] obtained by the respective charge sharing capacitors Cb1 to Cb4, and the discrete time sample stream vcr[n] corresponding to the output of the first switched capacitor circuit 103 can be obtained in accordance with equations 13 to 16, respectively.

[Equation 5]

$$H1(z) = \frac{Cr}{Cr+Cb1-Cb1\cdot z^{-1}} \quad (13)$$

[Equation 6]

$$H2(z) = \frac{Cr}{Cr+Cb1-Cb1\cdot z^{-1}} \cdot \frac{Cr}{Cr+Cb2-Cb2\cdot z^{-1}} \quad (14)$$

[Equation 7]

$$H3(z) = \frac{Cr}{Cr+Cb1-Cb1\cdot z^{-1}} \cdot \frac{Cr}{Cr+Cb2-Cb2\cdot z^{-1}} \cdot \frac{Cr}{Cr+Cb3-Cb3\cdot z^{-2}} \quad (15)$$

[Equation 8]

$$H4(z) = \frac{Cr}{Cr+Cb1-Cb1\cdot z^{-1}} \cdot \frac{Cr}{Cr+Cb2-Cb2\cdot z^{-1}} \cdot \frac{Cr}{Cr+Cb4-Cb4\cdot z^{-2}} \quad (16)$$

According to equations 13 to 16, a high-order IIR filter in which no pass loss occurs in a passband is realized as in the first example. Each of equation 8 (see first example) and equation 15 contains a term including the minus fourth power of z, which indicates that a fourth-order IIR filter is realized.

As described above, in the third example according to the first embodiment of the present invention, at least one charge sharing switch among the charge sharing switches 121, 123, 125, and 127 is controlled so as to be ON-OFF once during a time period which is longer than or equal to twice the predetermined time period (period C, period D), and the charge sharing switches other than the at least one charge sharing switch are controlled so as to be ON-OFF once during the predetermined time period.

In the third example according to the first embodiment of the present invention, it is possible to realize a mixer which has an enhanced frequency selection function and a high-order IIR filter characteristic in which no pass loss occurs in a signal passband, without enhancing an operating frequency necessary for driving a circuit so as to be higher than a sampling CLK. In addition, in the third example, it is possible to obtain the high-order IIR filter characteristic, and simultaneously shorten the predetermined charging time period for the integration capacitors Cr1 and Cr2, so that it is possible to obtain characteristic of the IIR filter having the same number of orders as described for the first example even when the operation time for driving the mixer is strictly restricted.

(4) FOURTH EXAMPLE

Figure 8:
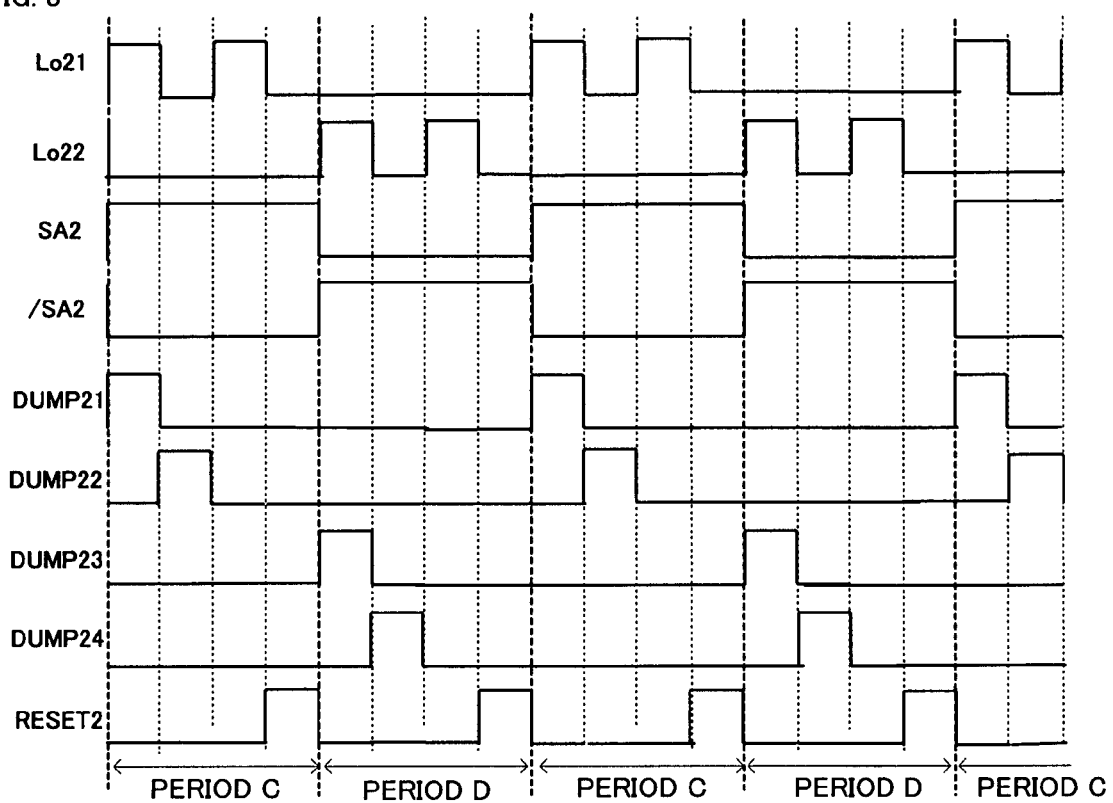
FIG. 8 is a timing chart of an operation control signal of a fourth example according to the first embodiment of the present invention.

In a fourth example according to the first embodiment of the present invention, the mixer 300 having the structure (see FIG. 6) as described for the third example is used. In the fourth example, the mixer 300 is operated in accordance with a timing chart different from the timing chart used for the third example. FIG. 8 shows a timing chart of an operation control signal of the fourth example according to the first embodiment of the present invention. Hereinafter, an operation performed by the mixer 300 in the fourth example will be described with reference to FIGS. 6 and 8.

The timing chart shown in FIG. 8 is the same as the timing chart shown in FIG. 7 except for supply times at which the charge sharing operation control signals DUMP21, DUMP22, DUMP23, and DUMP24 are supplied by the time control section 102. In the third example, some of the charge sharing operation control signals DUMP21, DUMP22, DUMP23, and DUMP24 are supplied once during the predetermined time period (period C, period D), and the others are supplied once during a time period longer than the predetermined time period. On the other hand, in the fourth example, each of the charge sharing operation control signals DUMP21, DUMP22, DUMP23, and DUMP24 is supplied once in a time period longer than the predetermined time period. Except that, the timing chart shown in FIG. 8 is the same as the timing chart shown in FIG. 7, and therefore repeated description is not given.

An operation performed by the second switched capacitor circuit 104 will be described. Initially, an operation performed during period C shown in FIG. 8 will be described. As shown in FIG. 8, the charge sharing operation control signal DUMP21 is at the high level during a high level period of a first ON-OFF (high level-low level) cycle of the integration operation control signal Lo21. Thus, the charge sharing switch 121 is ON, and therefore a charge of the integration capacitor Cr2 and a charge of the charge sharing capacitor Cb1 are shared by the integration capacitor Cr2 and the charge sharing capacitor Cb1 (see FIG. 6). Next, the charge sharing operation control signal DUMP22 is at the high level during a low level period of the first ON-OFF cycle of the integration operation control signal Lo21. Thus, the charge sharing switch 123 is ON, and therefore a charge of the integration capacitor Cr2 and a charge of the charge sharing capacitor Cb2 are shared by the integration capacitor Cr2 and the charge sharing capacitor Cb2. Thereafter, the discharge operation control signal RESET2 is at the high level during a given time period, whereby a charge of the integration capacitor Cr2 is reset (discharged).

Next, an operation performed during period D shown in FIG. 8 will be described. As shown in FIG. 8, the charge sharing operation control signal DUMP23 is at the high level during a high level period of a first ON-OFF cycle of the integration operation control signal Lo22. Thus, the charge sharing switch 125 is ON, and therefore a charge of the integration capacitor Cr1 and a charge of the charge sharing capacitor Cb3 are shared by the integration capacitor Cr1 and the charge sharing capacitor Cb3 (see FIG. 6). Next, the charge sharing operation control signal DUMP24 is at the high level during a low level period of the first ON-OFF cycle of the integration operation control signal Lo22. Thus, the charge sharing switch 127 is ON, and therefore a charge of the integration capacitor Cr1 and a charge of the charge sharing capacitor Cb4 are shared by the integration capacitor Cr1 and the charge sharing capacitor Cb4. Thereafter, the discharge operation control signal RESET2 is at the high level during a given time period, whereby a charge of the integration capacitor Cr1 is reset (discharged). The second switched capacitor circuit 104 alternately repeats the operation for period C and the operation for period D as described above.

As described above, the second switched capacitor circuit 104 controls ON-OFF operations of the charge sharing switches 121, 123, 125, and 127 in accordance with the charge sharing operation control signals DUMP21, DUMP22, DUMP23, and DUMP24, respectively, which are supplied by the time control section 102. Thus, the second switched capacitor circuit 104 processes a discrete time sample stream vcr[n] corresponding to an output of the first switched capacitor circuit 103, and outputs the processed discrete time sample stream to the output terminal 105.

As described above, in the fourth example according to the first embodiment of the present invention, at least one of the charge sharing switches is controlled so as to be ON-OFF once during a time period which is longer than or equal to twice the predetermined time period (period C, period D). Further, in the fourth example according to the first embodiment of the present invention, as in the third example, the predetermined charging time period during which each of the integration capacitors Cr1 and Cr2 is charged can be shorter than those described for the first and the second examples (see FIG. 1, FIG. 2, FIG. 4, and FIG. 5). In addition, in the fourth example, for the same reason as described for the first example, the time control section 102 is not required to output an operation control signal having an operating frequency higher than an operating frequency of each of the integration operation control signals Lo21 and Lo22 (see FIG. 8). Thus, in the fourth example, as in the first example, it is possible to realize a high-order IIR filter without enhancing an operating frequency necessary for driving the mixer 300 so as to be higher than an operating frequency of each of the integration operation control signals Lo21 and Lo22.

In the above description for the fourth example, each of the charge sharing operation control signals DUMP21, DUMP22, DUMP23, and DUMP24 is supplied once during a time period which is twice the predetermined time period (period C, period D). However, each of the charge sharing operation control signals DUMP21, DUMP22, DUMP23, and DUMP24 may be supplied once during a time period which is longer than twice the predetermined time period. Further, in the above description, the timing chart used for the third example is modified for the fourth example. However, the timing chart (see FIG. 2) used for the first example may be modified for the fourth example. Specifically, the timing chart shown in FIG. 2 may be modified such that each of the charge sharing operation control signals DUMP1, DUMP2, DUMP3, and DUMP4 may be supplied once during a time period which is longer than or equal to twice the predetermined time period (period A, period B).

Further, in each of the examples according to the first embodiment of the present invention, the charging time period (period A, period B, period C, period D) during which the first switched capacitor circuit 103 of the first example charges the integration capacitor Cr1 or Cr2 may be a time period other than the time period described for each of the first to the fourth examples. Further, the number of steps of the charge sharing capacitor of the second switched capacitor circuit 104 may not necessarily be four. For example, the charging time period during which the integration capacitor is charged may be extended, and the charge sharing capacitor of the second switched capacitor circuit 104 may have the increased number of steps. That is, the order of the IIR filter may be changed if increase of the frequency of the operation control signal is unnecessary.

Figure 9:
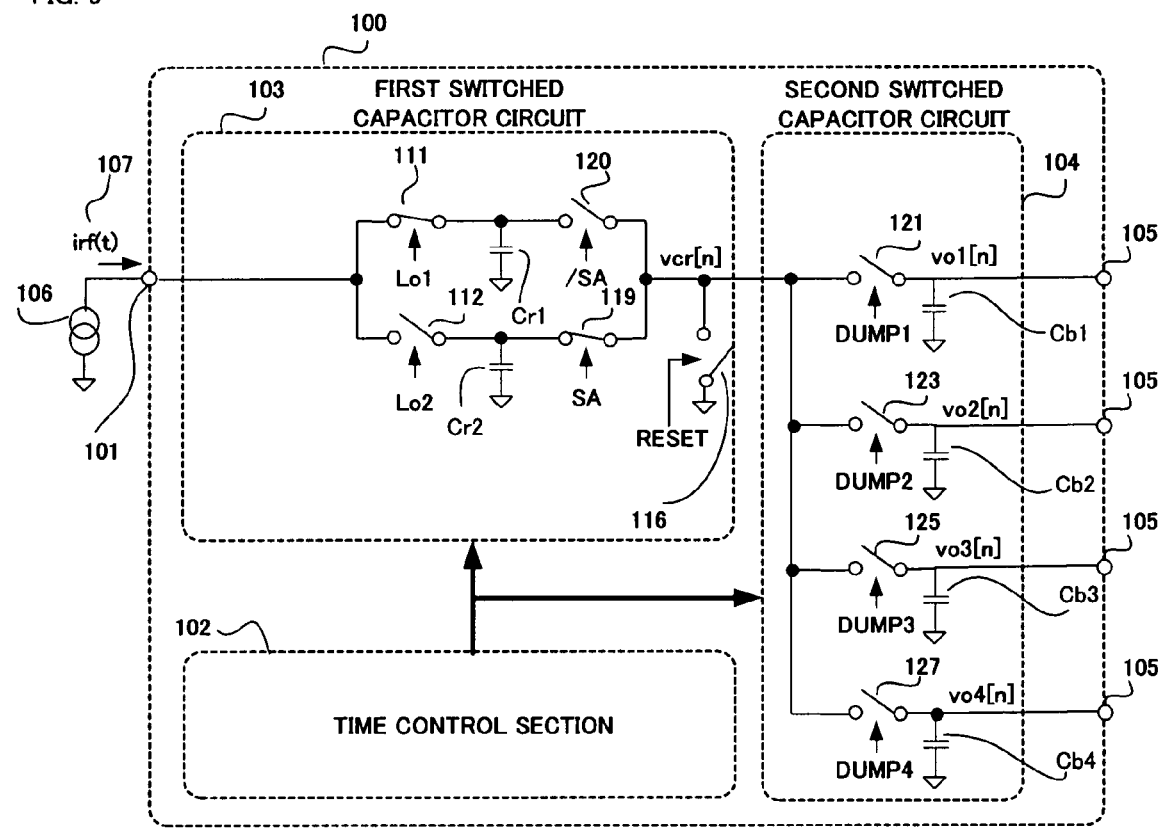
FIG. 9 is a diagram illustrating a structure of the mixer 100 in which charge sharing capacitors Cb1, Cb2, Cb3, and Cb4 each has an output terminal 105 in the first example according to the first embodiment of the present invention.

Further, in each of the examples according to the first embodiment of the present invention, the output terminal 105 may not necessarily be connected at such a position as to obtain a highest-order filter characteristic. Further, a plurality of output terminals may be provided so as to simultaneously obtain outputs of different band selection characteristics. FIG. 9 is a diagram illustrating a structure of the mixer 100 of the first example in which each of the charge sharing capacitors Cb1, Cb2, Cb3, and Cb4 includes the output terminal 105. For example, as shown in FIG. 9, at least two of the charge sharing capacitors Cb1, Cb2, Cb3, and Cb4 may individually include the output terminal 105, and further the charge sharing capacitors may have set therein values different from each other. Thus, it is possible to simultaneously obtain an output of a filter having narrow band frequency selection characteristic and an output of a filter having wide band frequency selection characteristic. Thus, for example, it is possible to obtain a level of a desired wave from the output of the filter having the narrow band frequency selection characteristic and simultaneously obtain a level of a wave including the desired wave and an interfering wave near the desired wave, from the output of the filter having the wide band frequency selection characteristic. For example, it is possible to calculate a level of the interfering wave based on the difference between both of the levels.

In each of the examples according to the first embodiment as described above, the time period during which each of the charge sharing operation control signal, the switch operation control signal and the discharge operation control signal, which are outputted by the time control section 102, is at the high level and the time period during which each of them is at the low level are each a time period which is longer than or equal to half a time period corresponding to one cycle of the integration operation control signal outputted by the time control section 102 (see FIG. 2, FIG. 5, FIG. 7, and FIG. 8). Further, in each of the examples of the first embodiment, at least two of the plurality of charge sharing switches of the second switched capacitor are each controlled so as to be ON-OFF once during the predetermined time period (see period A and period B shown in FIG. 2 and FIG. 5, and period C and period D shown in FIG. 7 and FIG. 8) at a different time.

Second Embodiment

Figure 10:
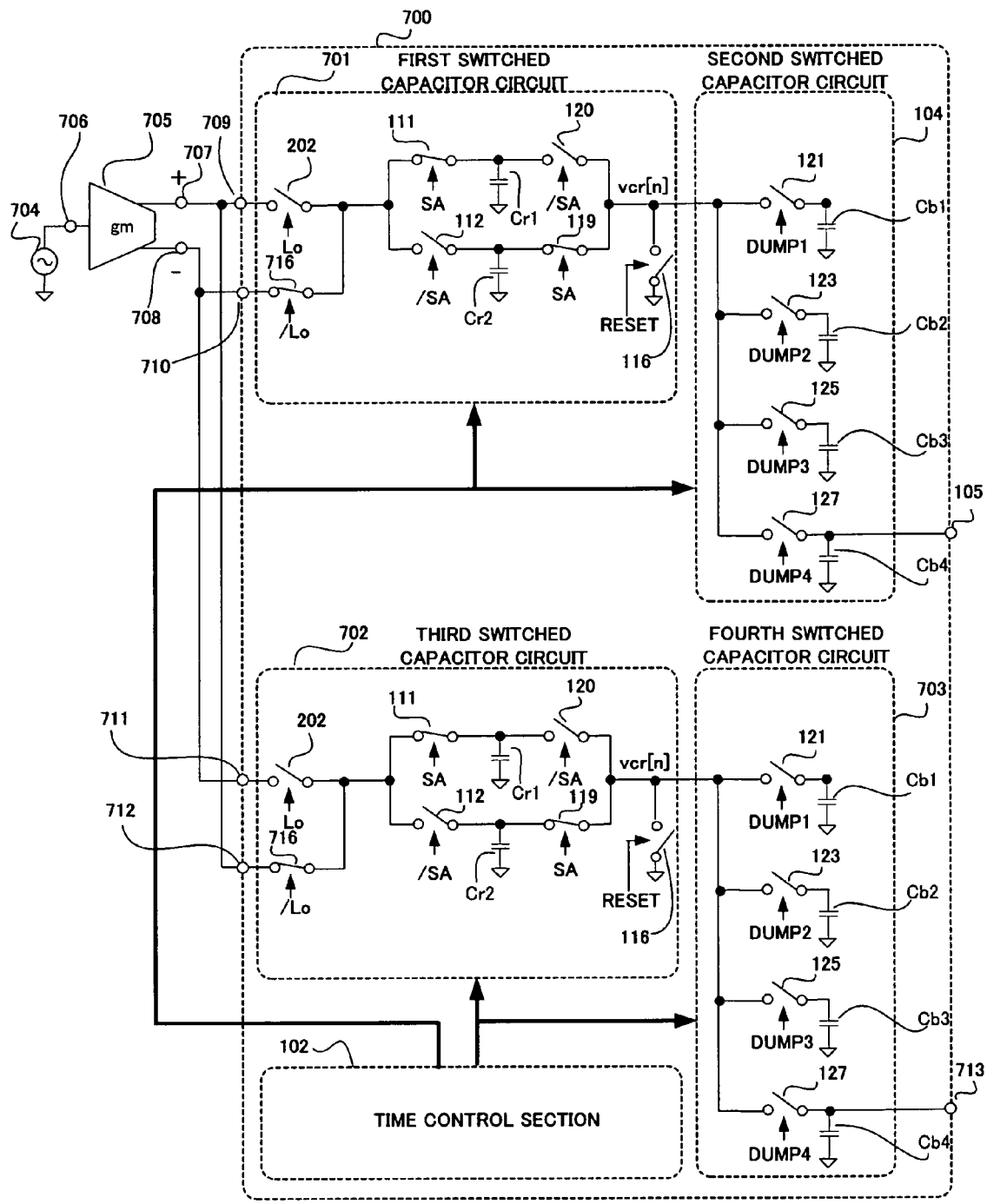
FIG. 10 is a diagram illustrating a structure of a differential mixer 700 having a frequency selection function according to a second embodiment of the present invention.
Figure 11:
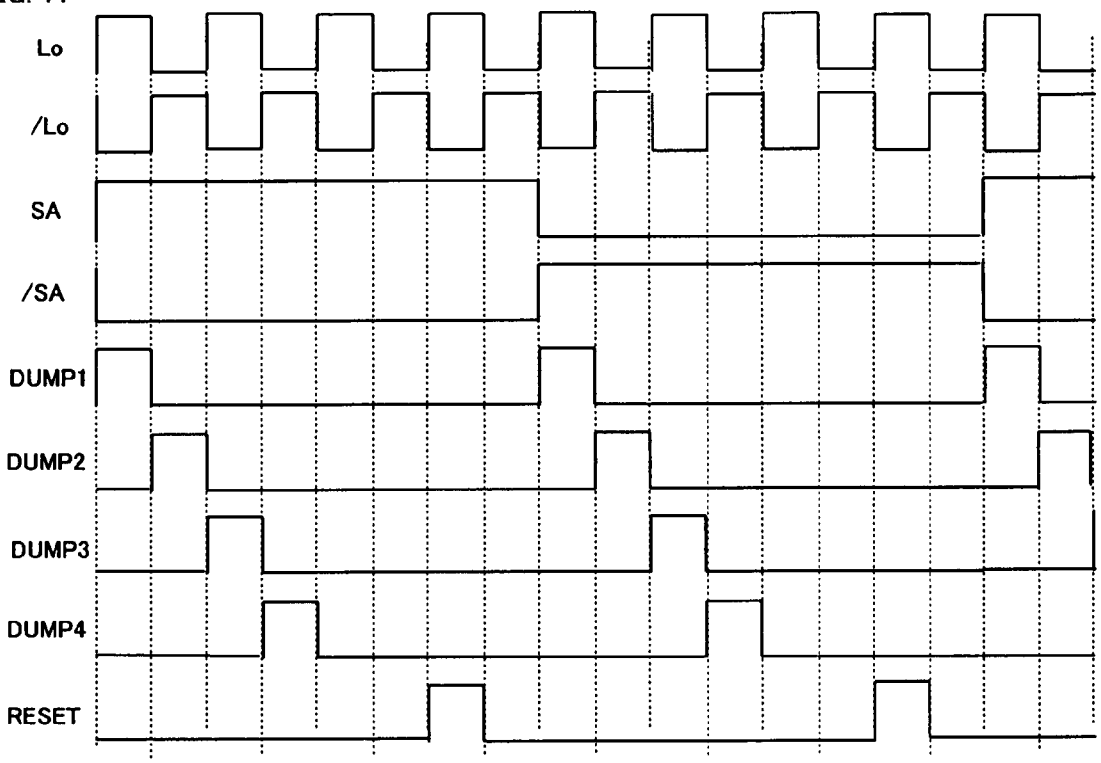
FIG. 11 is a timing chart of an operation control signal according to the second embodiment of the present invention.

FIG. 10 is a diagram illustrating a structure of a differential mixer 700 having a frequency selection function according to a second embodiment of the present invention. FIG. 11 shows a timing chart of an operation control signal according to the second embodiment of the present invention. The differential mixer 700 is structured such that two mixers 200 (see FIG. 4) of the second example according to the first embodiment are positioned in parallel with each other and each of the two mixers 200 receives a differential signal at an input thereof so as to perform a differential operation. The same components and the same operation control signals as described in the second example of the first embodiment are denoted by the same reference numerals as used in the second example of the first embodiment, and the description thereof is not given.

The differential mixer 700 includes: a first input terminal 709; a second input terminal 710: a third input terminal 711; a fourth input terminal 712; a first switched capacitor circuit 701; a second switched capacitor circuit 104; a third switched capacitor circuit 702; a fourth switched capacitor circuit 703; a time control section 102; a first output terminal 105; and a second output terminal 713. Inputs of the first switched capacitor circuit 701 are connected to the first input terminal 709 and the second input terminal 710, respectively. Further, inputs of the third switched capacitor circuit 702 are connected to the third input terminal 711 and the fourth input terminal 712, respectively. Further, an output of the first switched capacitor circuit 701 is connected to an input of the second switched capacitor circuit 104. Further, an output of the third switched capacitor circuit 702 is connected to an input of the fourth switched capacitor circuit 703. Further, an output of the second switched capacitor circuit 104 is connected to the first output terminal 105, and the output of the fourth switched capacitor circuit 703 is connected to the second output terminal 713. The time control section 102 supplies operation control signals to the first switched capacitor circuit 701, the second switched capacitor circuit 104, the third switched capacitor circuit 702, and the fourth switched capacitor circuit 703.

The first switched capacitor circuit 701 and the third switched capacitor circuit 702 have the same structure and are controlled in accordance with the same operation control signal. Further, the second switched capacitor circuit 104 and the fourth switched capacitor circuit 703 have the same structure and are controlled in accordance with the same operation control signal. Therefore, in FIG. 10, the same components and the same operation control signals are denoted by the same reference numerals.

The first switched capacitor circuit 701 is the same as the first switched capacitor circuit 201 (see FIG. 4) except that the first switched capacitor circuit 701 includes an integration operation switch 716 having its input connected to the second input terminal 710, and its output connected to an output of the integration operation switch 202. The integration operation switch 716 is controlled so as to be ON-OFF in accordance with the integration operation control signal /Lo supplied by the time control section 102. The integration operation control signal /Lo is a signal obtained by inverting a phase of the operation control signal Lo, as shown in FIG. 11.

Here, an output of the input signal source 704 corresponding to a voltage source is connected to an input 706 of a transconductance amplifier 705 performing differential outputs. The transconductance amplifier 705 coverts a received voltage signal into differential current signals, and outputs the differential current signals. Further, a non-inverting output 707 and an inverting output 708 of the transconductance amplifier 705 output currents (differential signal currents) of signals which are opposite in phase to each other. The non-inverting output 707 is connected to the first input terminal 709 and the fourth input terminal 712, and the inverting output 708 is connected to the second input terminal 710 and the third input terminal 711. This configuration allows the differential mixer 700 to function as a differential circuit, thereby obtaining differential output signals from the output terminal 105 and the output terminal 713 of the differential mixer 700.

As described above, according to the second embodiment, it is possible to realize a mixer which generates no pass loss in a signal passband, and has a high-order IIR filter characteristic and an enhanced frequency selection function without enhancing an operating frequency necessary for driving a circuit so as to be higher than a sampling CLK, and the mixer is operated in a differential manner.

In the above description, the two mixers 200 (see FIG. 4) of the second example according to the first embodiment are positioned in parallel with each other so as to form the differential mixer. However, two mixers of the examples other than the second example according to the first embodiment may be positioned in parallel with each other so as to form the differential mixer.

Figure 12:
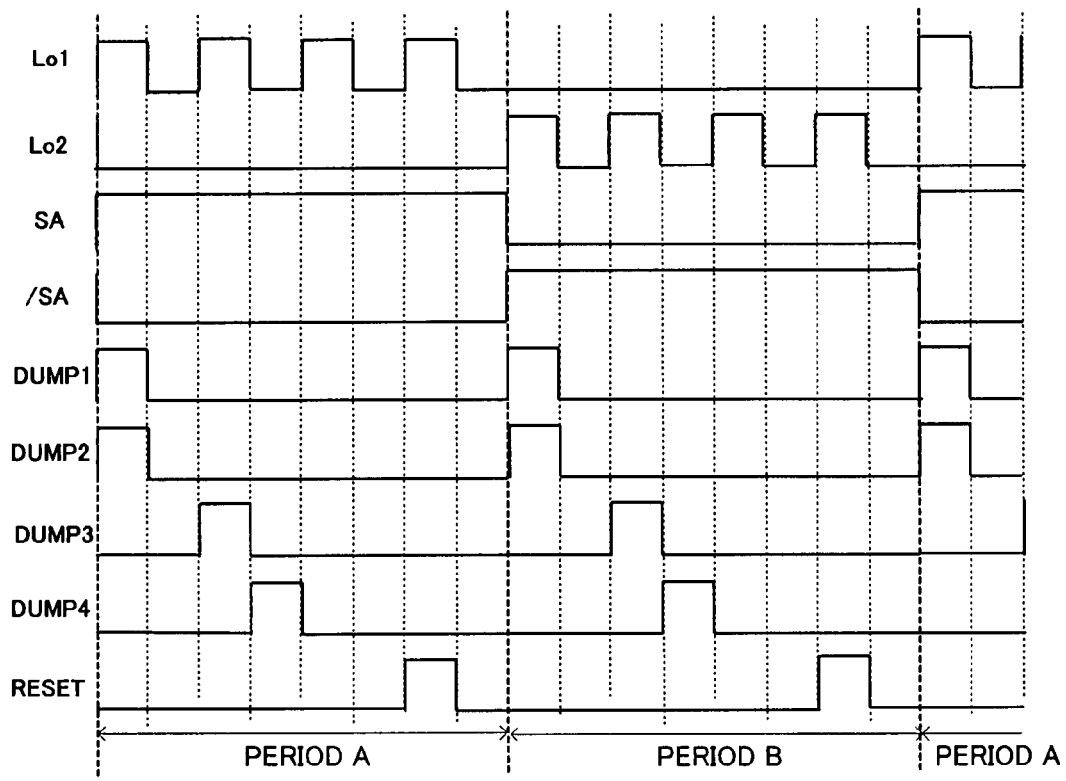
FIG. 12 is a timing chart which is a partial modification of the timing chart shown in FIG. 2 of the first example according to the first embodiment of the present invention.

Further, the mixer according to each of the first and the second embodiments of the present invention may allow the frequency selection characteristic to be changed in the following manner as necessary. For example, a plurality of separate capacitors may be provided as each of the charge sharing capacitors Cb1, Cb2, Cb3, and Cb4, and switching is performed among the plurality of separate capacitors in accordance with the necessary characteristic. Further, for example, some of the charge sharing switches may be controlled so as to be simultaneously ON-OFF. FIG. 12 shows a timing chart which is a partial modification of the timing chart shown in FIG. 2 of the first example according to the first embodiment. As shown in FIG. 12, the charge sharing operation control signals DUMP1 and DUMP2 are simultaneously supplied. Thus, the charge sharing switch 121 and the charge sharing switch 123 (see FIG. 1) are controlled so as to be simultaneously ON-OFF, so that the charge sharing capacitor Cb1 and the charge sharing capacitor Cb2 are allowed to function as one charge sharing capacitor having increased capacity. In this manner, the mixer according to each of the first and the second embodiments of the present invention allows the IIR filter characteristic to be easily and optionally changed.

Further, the mixer having the frequency selection function according to the first and the second embodiments of the present invention is used to form a radio communication device. Further, it is apparent that the entire or a main part of the radio communication device may be integrated on a semiconductor substrate as an integrated circuit. Thus, it is possible to realize a radio communication device such as a mobile communication terminal with reduced consumption of power at reduced cost.

While the invention has been described in detail, the foregoing description is in all aspects illustrative and not restrictive. It is understood that numerous other modifications and variations can be devised without departing from the scope of the invention.

What is claimed is:

1. A mixer having a frequency selection function, the mixer comprising:
   a first switched capacitor circuit including an integration switch having one input and two outputs, a selector switch having one output and two inputs respectively connected to the two outputs of the integration switch, two integration capacitors provided between ground and each of the two outputs of the integration switch, and a discharge switch provided between the ground and the one output of the selector switch;
   a second switched capacitor circuit having a plurality of circuits connected in parallel with each other, the plurality of circuits each including a corresponding one of a plurality of charge sharing switches and a corresponding one of a plurality of charge sharing capacitors provided between the ground and an output of each of the plurality of charge sharing switches, wherein inputs of the plurality of charge sharing switches are commonly connected to an output of the first switched capacitor circuit, and at least one of outputs of the plurality of charge sharing switches is used as an output of the second switched capacitor circuit; and
   a time control section operable to output an integration control signal used for controlling an operation time of the integration switch, a switch control signal used for controlling an operation time of the selector switch, a discharge control signal used for controlling an operation time of the discharge switch, and charge sharing control signals used for controlling operation times of the plurality of charge sharing switches,
   wherein the first switched capacitor circuit simultaneously performs both an operation of charging one of the two integration capacitors with an input signal in accordance with the integration control signal, and an operation of outputting, in accordance with the switch control signal, a charge of the other of the two integration capacitors having been charged, and discharging, in accordance with the discharge control signal, a residual charge of the other of the two integration capacitors having been discharged, and changes between the one of the two integration capacitors and the other thereof at intervals of a predetermined time period, so as to output a discrete time sample stream of the input signal to the second switched capacitor circuit,
   wherein the second switched capacitor circuit receives the discrete time sample stream, and controls the plurality of charge sharing switches so as to be ON-OFF in accordance with the charge sharing control signals, such that an output signal is outputted,
   wherein a time period during which each of the charge sharing control signals is at a high level and a time period during which each of the charge sharing control signals is at a low level are longer than or equal to a shortest time period among a high level period and a low level period of the integration control signal,
   wherein a time period during which the switch control signal is at a high level and a time period during which the switch control signal is at a low level are longer than or equal to the shortest time period among the high level period and the low level period of the integration control signal,
   wherein a time period during which the discharge control signal is at a high level and a time period during which the discharge control signal is at a low level are longer than or equal to the shortest time period among the high level period and the low level period of the integration control signal, and
   wherein at least two of the plurality of charge sharing switches are each controlled so as to be ON-OFF at a different time once during the predetermined time period.

2. The mixer according to claim 1, wherein each of the charge sharing switches is controlled so as to be ON-OFF once during the predetermined time period.

3. The mixer according to claim 1, wherein each of the charge sharing switches is controlled so as to be ON-OFF once during a time period which is longer than or equal to twice the predetermined time period.

4. The mixer according to claim 1, wherein
   at least one of the plurality of charge sharing switches is controlled so as to be ON-OFF once during a time period which is longer than or equal to twice the predetermined time period, and
   the others of the plurality of charge sharing switches are each controlled so as to be ON-OFF once during the predetermined time period.

5. The mixer according to claim 1, wherein at least two of the plurality of charge sharing switches are controlled so as to be simultaneously ON-OFF.

6. The mixer according to claim 1, wherein the second switched capacitor circuit uses, as outputs, at least two of the outputs of the plurality of charge sharing switches.

7. A differential mixer, including two mixers according to claim 1, operable to perform a differential operation.

* * * * *